United States Patent
Sakakibara

(10) Patent No.: US 12,274,115 B2
(45) Date of Patent: Apr. 8, 2025

(54) LIGHT-EMITTING ELEMENT, LIGHT-EMITTING DEVICE, METHOD FOR MANUFACTURING LIGHT-EMITTING ELEMENT, AND METHOD FOR DRIVING LIGHT-EMITTING ELEMENT

(71) Applicant: SHARP KABUSHIKI KAISHA, Sakai (JP)

(72) Inventor: Yusuke Sakakibara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 333 days.

(21) Appl. No.: 17/768,073

(22) PCT Filed: Oct. 15, 2019

(86) PCT No.: PCT/JP2019/040517
§ 371 (c)(1),
(2) Date: Apr. 11, 2022

(87) PCT Pub. No.: WO2021/074974
PCT Pub. Date: Apr. 22, 2021

(65) Prior Publication Data
US 2023/0337455 A1    Oct. 19, 2023

(51) Int. Cl.
*H10K 50/813*   (2023.01)
*G09G 3/3208*   (2016.01)
(Continued)

(52) U.S. Cl.
CPC ......... *H10K 50/165* (2023.02); *G09G 3/3208* (2013.01); *H10K 50/813* (2023.02); *H10K 50/822* (2023.02)

(58) Field of Classification Search
CPC ............ H10K 50/00–88; H10K 59/35; H10K 59/80521; H10K 59/8052;
(Continued)

(56) References Cited

U.S. PATENT DOCUMENTS 10,388,902 B1 * 8/2019 Palles-Dimmock ......................... H10K 50/115
2005/0211998 A1 * 9/2005 Daniels ............ H01L 27/14625
257/89

(Continued)

FOREIGN PATENT DOCUMENTS

JP       2009-288735 A        12/2009
JP       2011165781 A  *      8/2011
(Continued)

OTHER PUBLICATIONS

Translation of Yukio (Year: 2011).*

*Primary Examiner* — Shahed Ahmed
*Assistant Examiner* — Rhys Poniente Sheker
(74) *Attorney, Agent, or Firm* — ScienBiziP, P.C.

(57) ABSTRACT

A light-emitting element includes: a cathode; an anode; and an electron-transport layer, a light-emitting layer, and a hole-transport layer provided, between the cathode and the anode, in a stated order from the cathode. At least one of the electron-transport layer or the hole-transport layer includes: a first charge-transport layer and a second charge-transport layer containing different carrier-transport materials. The light-emitting element includes, in plan view, a first region including the first charge-transport layer, and a second region including the second charge-transport layer. The light-emitting element shares the anode and the cathode between the first region and the second region.

1 Claim, 20 Drawing Sheets

(51) Int. Cl.
  *H10K 50/165* (2023.01)
  *H10K 50/822* (2023.01)
(58) Field of Classification Search
  CPC ............ H10K 59/10–221; H05B 33/10; H05B 33/12; H05B 33/22; G09G 3/3208
  See application file for complete search history.

(56) References Cited

U.S. PATENT DOCUMENTS

2015/0145906 A1   5/2015  Uetake
2015/0379924 A1  12/2015  Matsueda et al.
2020/0328368 A1* 10/2020  Chung ................. H10K 50/816
2021/0288281 A1*  9/2021  Li ......................... C09K 11/70

FOREIGN PATENT DOCUMENTS

| JP | 2014-156420 A | 8/2014 |
| JP | 2015-102723 A | 6/2015 |
| JP | 2016-009636 A | 1/2016 |
| KR | 10-2016-0033520 A | 3/2016 |

* cited by examiner

LIGHT-EMITTING ELEMENT, LIGHT-EMITTING DEVICE, METHOD FOR MANUFACTURING LIGHT-EMITTING ELEMENT, AND METHOD FOR DRIVING LIGHT-EMITTING ELEMENT

TECHNICAL FIELD

The disclosure relates to a light-emitting element including a light-emitting layer, and a light-emitting device including the light-emitting element.

BACKGROUND ART

Patent Document 1 relates to a display device including a plurality of light-emitting elements, and discloses a technique to individually drive each of the light-emitting elements with a plurality of pixel electrodes.

CITATION LIST

Patent Literature

[Patent Document 1] Japanese Unexamined Patent Application Publication No. 2015-102723

SUMMARY

Technical Problem

In order to drive the light-emitting elements described in Patent Document 1, each of the light-emitting elements has to include a plurality of sub-pixel circuits. Accordingly, the configuration of a substrate provided with the sub-pixel circuits is complex.

Solution to Problem

In order to solve the above problem, a light-emitting element according to an aspect of the disclosure includes: a cathode; an anode; and an electron-transport layer, a light-emitting layer, and a hole-transport layer provided, between the cathode and the anode, in a stated order from the cathode. The light-emitting element further includes: a first region in plan view; and a second region in plan view and different from the first region. At least one of the electron-transport layer or the hole-transport layer includes, in plan view, a first charge-transport layer provided in the first region, and a second charge-transport layer provided in the second region. The first charge-transport layer and the second charge-transport layer contain different carrier-transport layers. The light-emitting element shares the anode and the cathode between the first region and the second region.

In order to solve the above problem, a method for manufacturing a light-emitting element includes: a cathode; an anode; and an electron-transport layer, a light-emitting layer, and a hole-transport layer provided, between the cathode and the anode, in a stated order from the cathode. The method includes: a cathode forming step of forming the cathode; an anode forming step of forming the anode; a light-emitting layer forming step of forming the light-emitting layer between the cathode and the anode; an electron-transport layer forming step of forming the electron-transport layer between the cathode and the light-emitting layer; and a hole-transport layer forming step of forming the hole-transport layer between the anode and the light-emitting layer. At least one of the electron-transport layer forming step or the hole-transport layer forming step includes: a first charge-transport layer forming step of forming a first charge-transport layer in a first region in plan view, and a second charge-transport layer forming step of forming a second charge-transport layer in a second region in plan view. The second region is different from the first region, and the second charge-transport layer contains a carrier-transport material different from a carrier-transport material of the first charge-transport material. The first region and the second region share the anode and the cathode.

In order to solve the above problem, a method is used for driving a light-emitting element including: a cathode; an anode; and an electron-transport layer, a light-emitting layer, and a hole-transport layer provided, between the cathode and the anode, in a stated order from the cathode, the light-emitting element further including: a first region in plan view; and a second region in plan view and different from the first region. At least one of the electron-transport layer or the hole-transport layer includes, in plan view, a first charge-transport layer provided in the first region, and a second charge-transport layer provided in the second region. The first charge-transport layer and the second charge-transport layer contain different carrier-transport layers. The method includes driving, by the light-emitting element, the anode and the cathode provided in common between the first region and the second region.

Advantageous Effects of Invention

An aspect of the disclosure can easily change characteristics of a light-emitting element in the light-emitting element. Hence, even if each of the light-emitting elements is driven with a single pixel electrode, the device including the light-emitting elements can improve in gradation control.

DESCRIPTION OF EMBODIMENTS

First Embodiment

Figure 1:
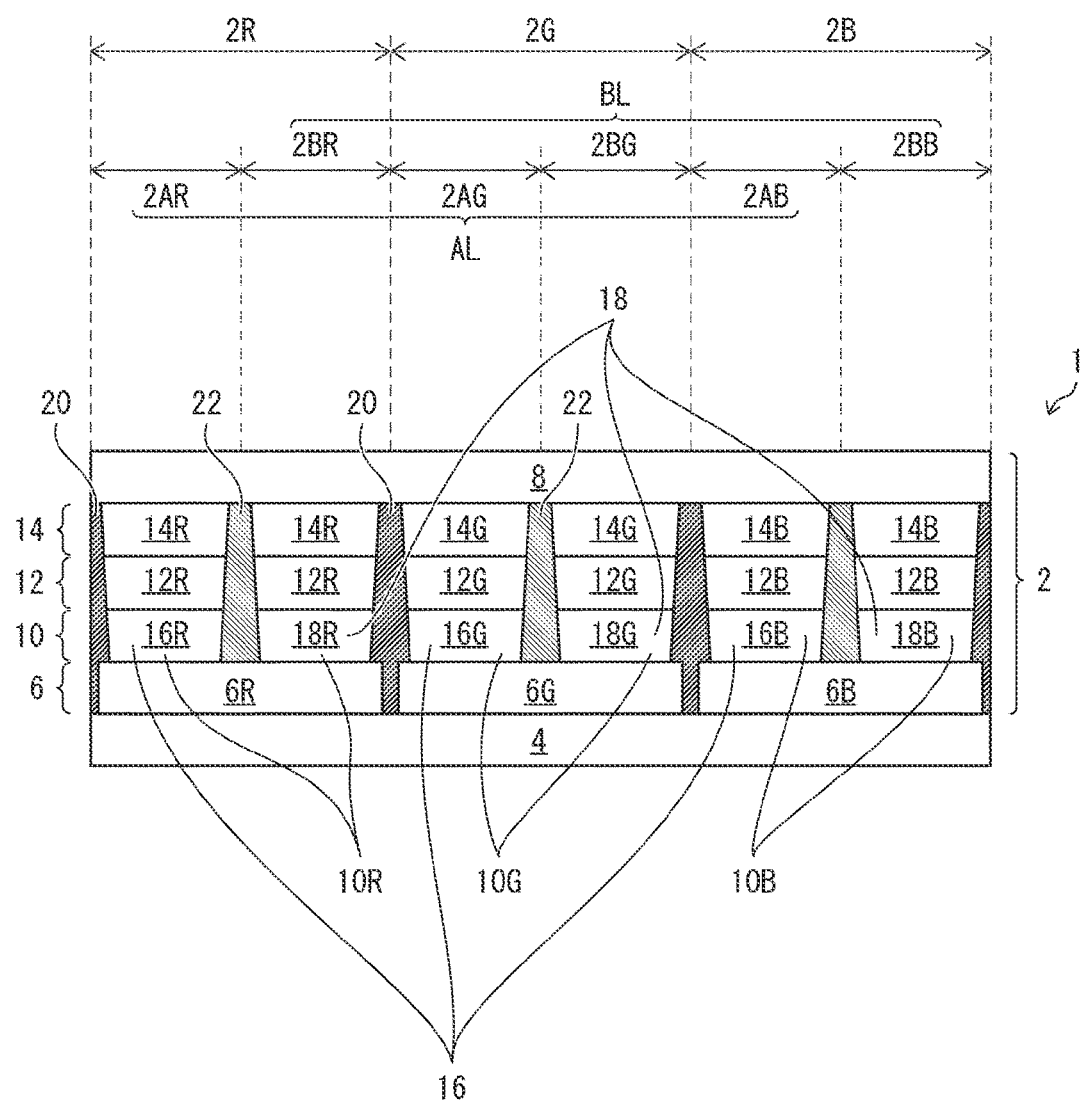
FIG. 1 is a schematic cross-sectional view of a display device according to a first embodiment of the disclosure.
Figure 2:
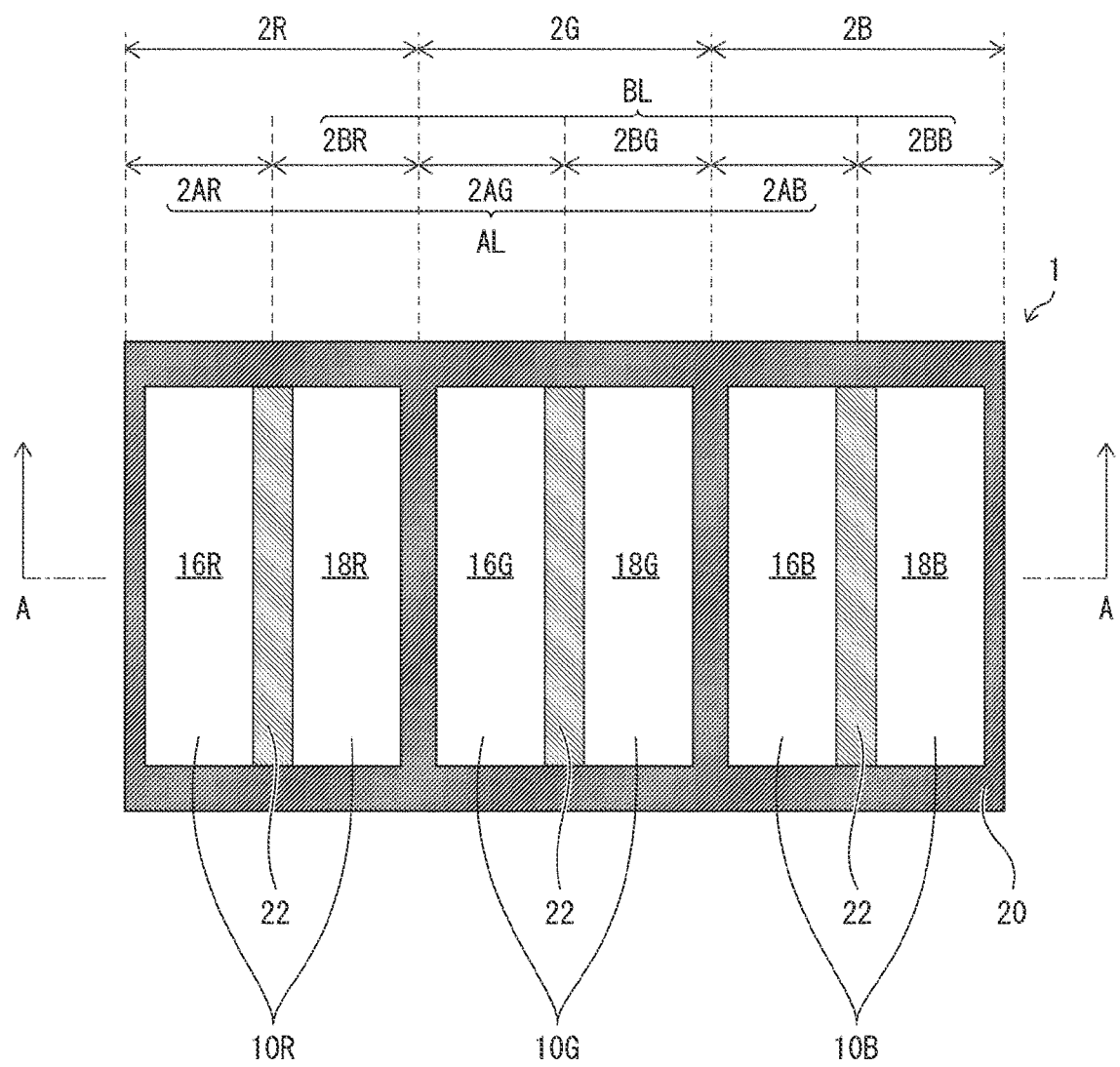
FIG. 2 is a schematic plan view of the display device according to the first embodiment of the disclosure.

FIG. 2 is a schematic plan view of a display device 1 according to this embodiment. FIG. 1 is a schematic cross-sectional view of the display device 1 according to this embodiment, viewed along arrows A-A in FIG. 2. Note that the plan views of DESCRIPTION including FIG. 2 omit illustrations of an anode 8, a light-emitting layer 12, and a hole-transport layer 14 to be described later in detail. Moreover, in DESCRIPTION, a direction from an array substrate 4 toward a light-emitting element 2 to be described later in detail is an upward direction.

The display device 1 according to this embodiment includes the light-emitting element 2 provided on the array substrate 4. The display device 1 includes a plurality of sub-pixels. In particular, in this embodiment, the display device 1 includes: a plurality of red sub-pixels; a plurality of green sub-pixels; and a plurality of blue sub-pixels. DESCRIPTION illustrates one each of the red sub-pixels, the green sub-pixels, and the blue sub-pixels included in the display device 1. However, the display device 1 may be provided with any given number of the sub-pixels, and may include a plurality of the red, green, and blue sub-pixels.

The light-emitting element 2 includes: a cathode 6 that is a plurality of pixel electrodes each shaped into an island for a corresponding one of the sub-pixels; and the anode 8 formed in common among the sub-pixels and provided as a common electrode. Furthermore, the light-emitting element 2 includes an electron-transport layer 10, the light-emitting layer 12, and the hole-transport layer 14, all of which are provided between the cathode 6 and the anode 8 from the cathode 6 to the anode 8.

The light-emitting element 2 includes sub light-emitting elements each corresponding to one of the sub-pixels. In particular, in this embodiment, the light-emitting element 2 includes: a red light-emitting element 2R corresponding to a red sub-pixel; a green light-emitting element 2G corresponding to a green sub-pixel; and a blue light-emitting element 2B corresponding to a blue sub-pixel.

In this embodiment, each of the layers from the cathode 6 to the hole-transport layer 14 is individually provided to the sub-pixels.

Specifically, the cathode 6 includes: a cathode 6R for the red sub-pixel; a cathode 6G for the green sub-pixel; and a cathode 6B for the blue sub-pixel. The electron-transport layer 10 includes: an electron-transport layer 10R for the red sub-pixel; an electron-transport layer 10G for the green sub-pixel; and an electron-transport layer 10B for the blue sub-pixel. The light-emitting layer 12 includes: a red light-emitting layer 12R for the red sub-pixel; a green light-emitting layer 12G for the green sub-pixel; and a blue light-emitting layer 12B for the blue sub-pixel. The hole-transport layer 14 includes: a hole-transport layer 14R for the red sub-pixel; a hole-transport layer 14G for the green sub-pixel; and a hole-transport layer 14B for the blue sub-pixel.

Meanwhile, the anode 8 is formed in common among the sub-pixels.

Hence, the red light-emitting element 2R includes: the cathode 6R; the electron-transport layer 10R; the red light-emitting layer 12R; the hole-transport layer 14R; and the anode 8. Moreover, the green light-emitting element 2G includes: the cathode 6G; the electron-transport layer 10G; the green light-emitting layer 12G; the hole-transport layer 14G; and the anode 8. Furthermore, the blue light-emitting element 2B includes: the cathode 6B; the electron-transport layer 10B; the blue light-emitting layer 12B; the hole-transport layer 14B; and the anode 8.

In this embodiment, a voltage may be individually applied to each cathode 6 with a not-shown sub-pixel circuit formed on the array substrate 4. In addition, a constant voltage may be applied to the anode 8. Hence, the voltage to be applied to each cathode 6 is individually controlled so that each of the sub light-emitting elements can be individually driven.

At least one of the cathode 6 or the anode 8 is a transparent electrode. Moreover, either the cathode 6 or the anode 8 may be a reflective electrode. For example, in this embodiment, the cathode 6 may be a reflective electrode, and the anode 8 may be a transparent electrode. In such a case, light from the light-emitting element 2 is emitted from the array substrate 4 toward the light-emitting element 2. In other words, the display device 1 is a top-emission display device. Note that, the display device 1 according to this embodiment does not have to be a top-emission display device. In the display device 1 according to this embodiment, the cathode 6 may be a transparent electrode, the anode 8 may be a reflective electrode, and the multilayer structure of the light-emitting element 2 may be inverted.

Both the electron-transport layer 10 and the hole-transport layer 14 contain a carrier-transport material. The electron-transport layer 10 contains an electron-transport material, and the hole-transport layer 14 contains a hole-transport material. The electron-transport layer 10 is capable of transporting electrons from the cathode 6 to the light-emitting layer 12. The hole-transport layer 14 is capable of transporting holes from the anode 8 to the light-emitting layer 12.

The light-emitting layer 12 emits light by recombination of the electrons injected through the cathode 6 and the electron-transport layer 10 and the holes injected through the anode 8 and the hole-transport layer 14. The red light-emitting layer 12R emits red light. The green light-emitting layer 12G emits green light. The blue light-emitting layer 12B emits blue light. Hence, when each cathode 6 is driven, the red light-emitting element 2R emits red light, the green light-emitting element 2G emits green light, and the blue light-emitting element 2B emits blue light.

Here, the blue light has, for example, a center wavelength in a wavelength band ranging from 400 to 500 nm. The green light has, for example, a center wavelength in a wavelength band of longer than 500 nm and 600 nm or shorter. The red light has, for example, a center wavelength in a wavelength band of longer than 600 nm and 780 nm or shorter.

Each of the light-emitting layers 12 may contain, as a light-emitting material, an organic light-emitting material such as an organic fluorescent material and an organic phosphorescent material. Alternatively, the light-emitting layer 12 may contain, as a light-emitting material, inorganic semiconductor nanoparticles; that is, in other words, inorganic quantum dots.

Here, as illustrated in FIGS. 1 and 2, each of the sub light-emitting elements includes, in plan view, a first region AL, and a second region BL different from the first region AL. Each sub light-emitting element is divided into the first region AL and the second region BL. Specifically, the red light-emitting element 2R includes: a first red light-emitting element 2AR in the first region AL; and a second red light-emitting element 2BR in the second region BL. Moreover, the green light-emitting element 2G includes: a first green light-emitting element 2AG in the first region AL; and a second green light-emitting element 2BG in the second region BL. Furthermore, the blue light-emitting element 2B includes: a first blue light-emitting element 2AB in the first region AL, and a second blue light-emitting element 2BB in the second region BL.

In this embodiment, as illustrated in FIG. 1, each of the light-emitting layer 12 and the hole-transport layer 14 may be made of the same material between the first region AL and the second region BL for each of the sub light-emitting elements. For example, the first red light-emitting element 2AR and the second red light-emitting element 2BR may include, as the light-emitting layer 12, the red light-emitting layer 12R containing the same light-emitting layer material. Moreover, the first red light-emitting element 2AR and the second red light-emitting element 2BR may include, as the hole-transport layer 14, the hole-transport layer 14R containing the same carrier-transport material.

In this embodiment, as illustrated in FIGS. 1 and 2, the electron-transport layer 10 may contain different carrier-transport materials between the first region AL and the second region BL for each of the sub light-emitting elements. Specifically, the electron-transport layer 10 includes: a first electron-transport layer 16 formed in the first region AL and serving as a first charge-transport layer; and a second electron-transport layer 18 formed in the second region BL and serving as a second charge-transport layer.

The first electron-transport layer 16 includes: a first electron-transport layer 16R formed in the first red light-emitting element 2AR; a first electron-transport layer 16G formed in the first green light-emitting element 2AG; and a first electron-transport layer 16B formed in the first blue light-emitting element 2AB. Moreover, the second electron-transport layer 18 includes: a second electron-transport layer 18R formed in the second red light-emitting element 2BR; a second electron-transport layer 18G formed in the second green light-emitting element 2BG; and a second electron-transport layer 18B formed in the second blue light-emitting element 2BB.

Hence, in the red light-emitting element 2R, the first electron-transport layer 16R and the second electron-transport layer 18R share the cathode 6R; namely, a pixel electrode. Likewise, in the green light-emitting element 2G, the first electron-transport layer 16G and the second electron-transport layer 18G share the cathode 6G; namely, a pixel electrode. Furthermore, in the blue light-emitting element 2B, the first electron-transport layer 16B and the second electron-transport layer 18B share the cathode 6B; namely, a pixel electrode. In other words, each of the light-emitting elements according to this embodiment shares the cathode 6 and the anode 8 between the first region AL and the second region BL.

Note that the first electron-transport layer 16R, the first electron-transport layer 16G, and the first electron-transport layer 16B may contain the same carrier-transport material, or different carrier-transport materials from one another. Likewise, the second electron-transport layer 18R, the second electron-transport layer 18G, and the second electron-transport layer 18B may contain the same carrier-transport material, or different carrier-transport materials from one another. Furthermore, the hole-transport layer 14R, the hole-transport layer 14G, and the hole-transport layer 14B may contain the same carrier-transport material, or different carrier-transport materials from one another.

In this embodiment, the first region AL is as large in area as the second region BL in plan view. In particular, in this embodiment, the first region AL is as large in area as the second region BL in plan view among the sub light-emitting elements. Note that, in DESCRIPTION, the statement "one member is as large in area as another member in plan view" means that a difference in area due to manufacturing margin of error is allowable between the two members.

In this embodiment, the red light-emitting element 2R, the green light-emitting element 2G, and the blue light-emitting element 2B are partitioned from each other with first partition walls 20. The first partition walls 20 partition the cathode 6 through the hole-transport layer 14 into the sub light-emitting elements. Note that a first partition wall 20 may be formed in a position to cover a side face, and an edge of a top face, of each cathode 6.

Moreover, in each of the sub light-emitting elements, the first region AL and the second region BL are partitioned with second partition walls 22. The second partition walls 22 partition the electron-transport layer 10 through the hole-transport layer 14 into the first region AL and the second region BL. Note that, each cathode 6 is formed in common between the first region AL and the second region BL in each of the sub light-emitting elements. In other words, each cathode 6 is not divided into the first region AL and the second region BL.

The first partition walls 20 and the second partition walls 22 may contain the same material. Moreover, the first partition walls 20 and the second partition walls 22 are preferably made of an insulating material in order to reduce short circuit among the sub light-emitting elements and between the first region AL and the second region BL. For example, the first partition walls 20 and the second partition walls 22 may be made of such an organic material as polyimide.

Figure 3:
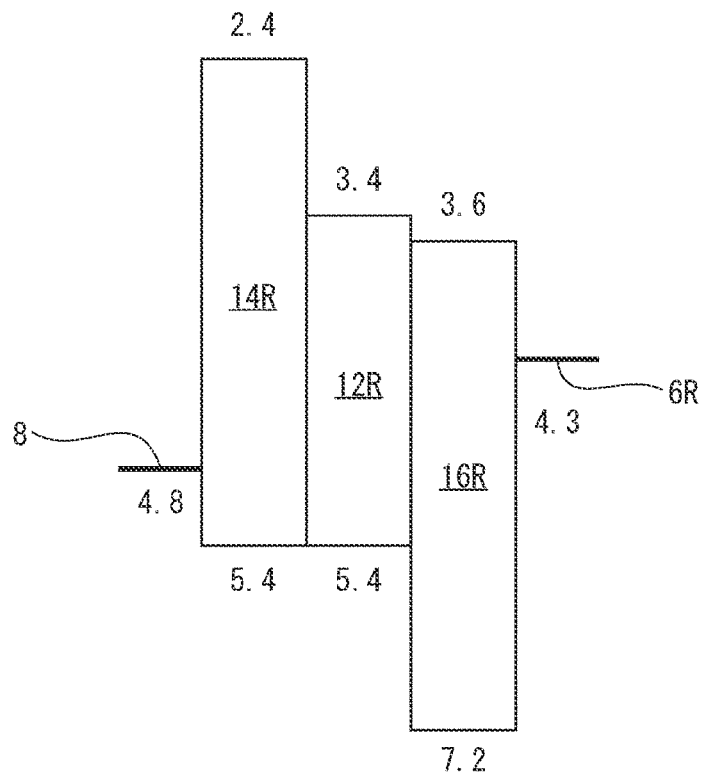
FIG. 3 is an energy diagram illustrating an example of a Fermi level or a band gap of each of the layers in a first region of a red light-emitting element according to the first embodiment of the disclosure.
Figure 4:
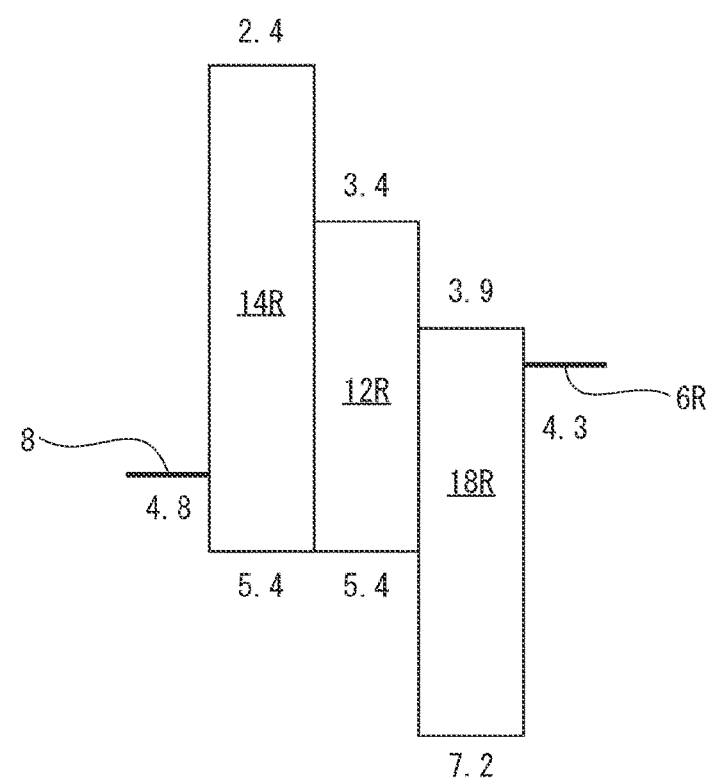
FIG. 4 is an energy diagram illustrating an example of a Fermi level or a band gap of each of the layers in a second region of the red light-emitting element according to the first embodiment of the disclosure.
Figure 5:
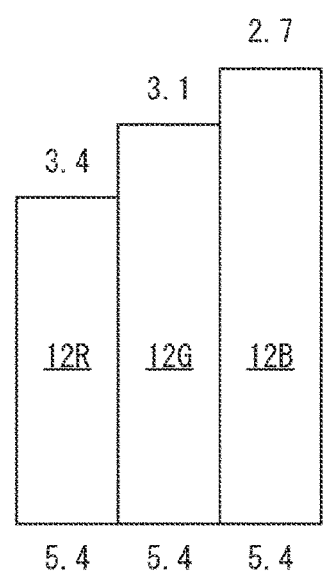
FIG. 5 is an energy diagram illustrating an example of a band gap of each of the layers according to the first embodiment of the disclosure.

Described next with reference to FIGS. 3 to 5 is an example of a Fermi level or an energy band of each of the layers in the light-emitting element 2 according to this embodiment.

FIG. 3 is an energy diagram illustrating an example of a Fermi level or an energy band of each of the layers in the first red light-emitting element 2AR according to this embodiment. FIG. 4 is an energy diagram illustrating an example of a Fermi level or an energy band of each of the layers in the second red light-emitting element 2BR according to this embodiment. FIG. 5 is an energy diagram illustrating an example of an energy band of each of the red light-emitting layer 12R, the green light-emitting layer 12G, and the blue light-emitting layer 12B.

Note that the energy diagrams in DESCRIPTION illustrate an energy level of each layer with reference to the vacuum level. Moreover, the energy diagrams of DESCRIPTION show the Fermi levels or the band gaps of the members corresponding to the assigned reference signs. The Fermi levels are indicated for the cathode 6 and the anode 8. The band gaps are indicated for the electron-transport layer 10, the light-emitting layer 12, and the hole-transport layer 14. Moreover, the numerical values in the energy diagrams of DESCRIPTION indicate energy values in the unit of eV with reference to the vacuum level of each level.

Furthermore, assumed below is the case where each of the cathode 6, the hole-transport layer 14, the first electron-transport layer 16, and the second electron-transport layer 18 is made of the same material even though they are included in the sub light-emitting elements.

In this embodiment, for example, the cathode 6 contains Al, and the anode 8 contains ITO. In this case, as illustrated in FIGS. 3 and 4, for example, the cathode 6R has a Fermi level of 4.3 eV, and the anode 8 has a Fermi level of 4.8 eV.

Moreover, in this embodiment, for example, the light-emitting layer 12 contains quantum dots in a core/shell structure, as a light-emitting material. Here, as to the quantum dots contained in the light-emitting layer 12, particle sizes of the cores of the quantum dots are controlled so that quantum dots can control the wavelength of the light emitted from the quantum dots. In other words, the particle sizes of the quantum dots are controlled so that the band gap of the quantum dots can be controlled.

Here, typically, among the quantum dots whose cores have different particle sizes, FIG. 5 shows that the upper-end levels of the valence band tend to rarely vary; whereas, the lower-end levels of the conduction band tend to vary significantly.

For example, FIGS. 3 to 5 show that, in the red light-emitting layer 12R, the upper-end level of the valence band is 5.4 eV, and the lower-end level of the conduction band is 3.4 eV. Moreover, FIG. 5 shows that, in the green light-emitting layer 12G, the upper-end level of the valence band is 5.4 eV, and the lower-end level of the conduction band is 3.1 eV. Furthermore, FIG. 5, shows that, in the blue light-emitting layer 12B, the upper-end level of the valence band is 5.4 eV, and the lower-end level of the conduction band is 2.7 eV.

In addition, in this embodiment, for example, the hole-transport layer 14 contains TFB as a hole-transport material. In such a case, for example, FIGS. 3 and 4 show that, in the red light-emitting layer 14R, the upper-end level of the valence band is 5.4 eV, and the lower-end level of the conduction band is 2.4 eV.

In this embodiment, the first electron-transport layer 16 contains $Zn_{1-x}Mg_xO$ as an electron-transport material. Here, x is a real number that satisfies $0 < x \leq 1$. When the real number x is adjusted, the band gap of $Zn_{1-x}Mg_xO$ can be controlled. For example, FIGS. 3 and 4 show that, in the electron-transport layer 16R, the upper-end level of the valence band is 7.2 eV, and the lower-end level of the conduction band is 3.6 eV.

In this embodiment, the second electron-transport layer 18R contains ZnO as an electron-transport material. FIG. 3 shows a case where the second electron-transport layer 18R contains ZnO as an electron-transport material. Here, for example, FIGS. 3 and 4 show that, in the second electron-transport layer 18R, the upper-end level of the valence band is 7.2 eV, and the lower-end level of the conduction band is 3.9 eV.

Figure 6:
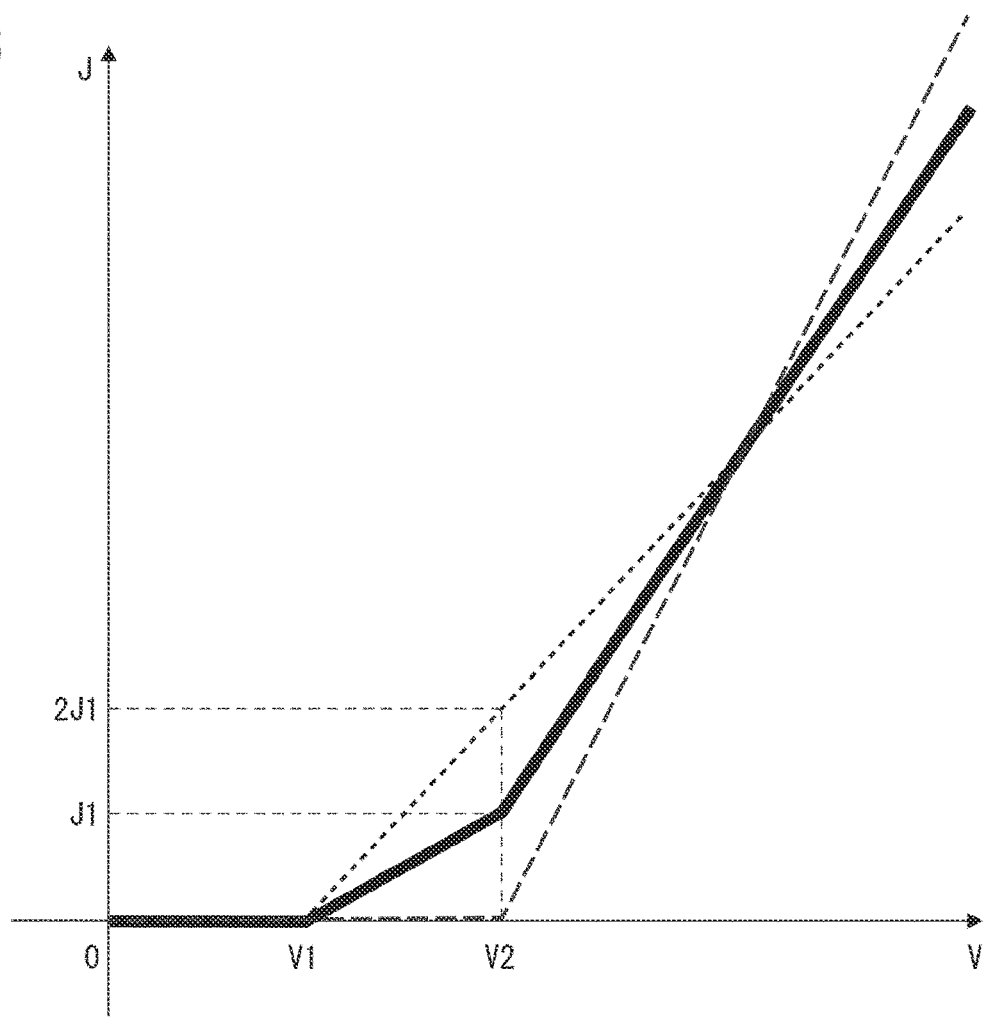
FIG. 6 is a graph illustrating a characteristic of the voltage and the current density of a light-emitting element according to the first embodiment of the disclosure.
Figure 7:
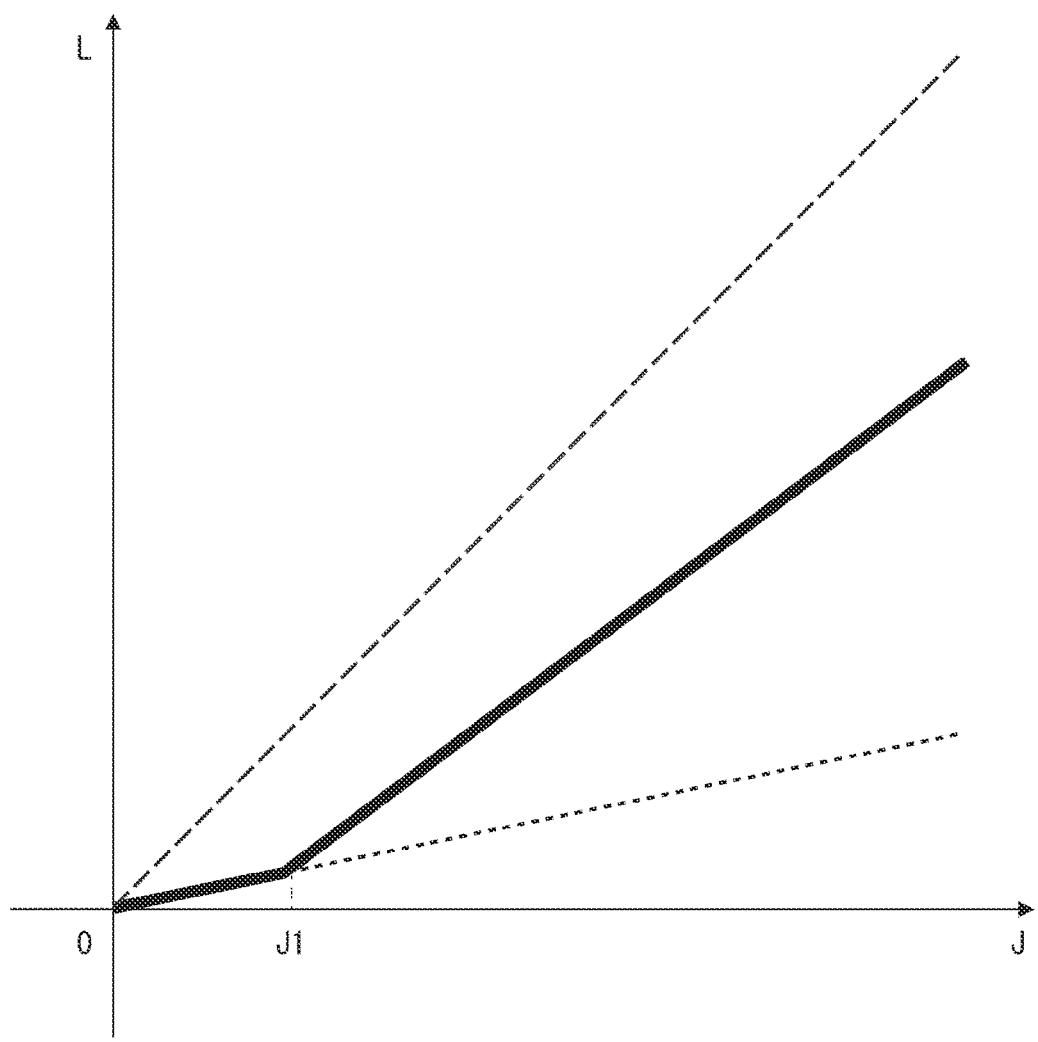
FIG. 7 is a graph illustrating a characteristic of the current density and the luminance of the light-emitting element according to the first embodiment of the disclosure.
Figure 8:
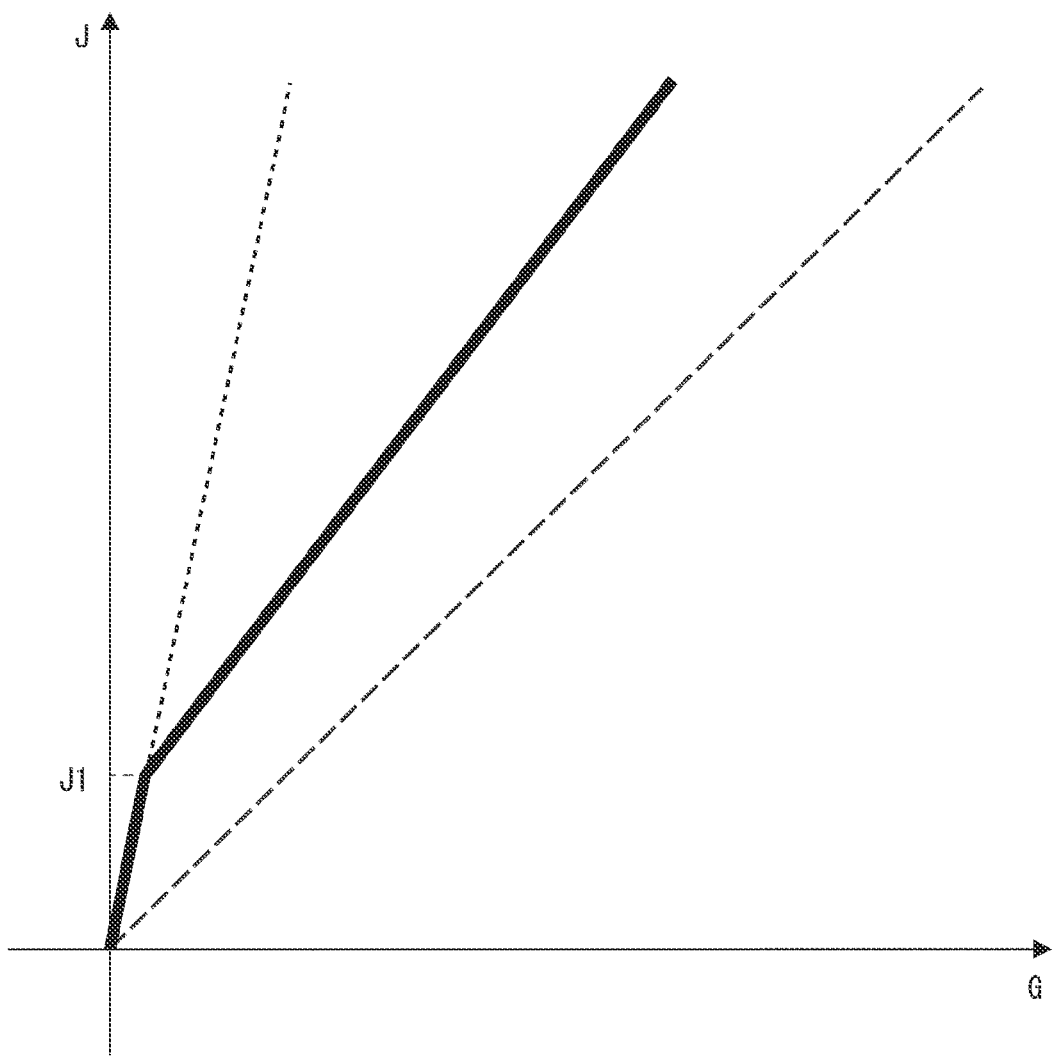
FIG. 8 is a graph illustrating a characteristic of the gradation value and the current density of the light-emitting element according to the first embodiment of the disclosure.

Described next with reference to FIGS. 6 to 8 are exemplary characteristics of the light-emitting element 2 according to this embodiment.

FIG. 6 is a graph illustrating an exemplary characteristic of the voltage and the current density of the light-emitting element. In other words, in FIG. 6, the horizontal axis represents the potential difference V applied between the electrodes of the light-emitting element, and the vertical axis represents the current density J of a current generated in the light-emitting element.

FIG. 7 is a graph illustrating an exemplary characteristic of the current density and the luminance of the light-emitting element. In other words, in FIG. 7, the horizontal axis represents the current density J of a current generated in the light-emitting element, and the vertical axis represents the luminance of the light-emitting element.

FIG. 8 is a graph illustrating an exemplary characteristic of the gradation value and the current density of the light-emitting element. In other words, in FIG. 8, the horizontal axis represents the gradation value G of a sub-pixel including the light-emitting element, and the vertical axis represents the current density J of a current generated in the light-emitting element when luminance corresponding to the gradation value G of the sub-pixel is obtained from the light-emitting element.

In FIGS. 6 to 8, the solid lines represent characteristics of the red light-emitting element 2R according to this embodiment. Moreover, the dotted lines represent characteristics of a red light-emitting element 2CR; that is, the above red light-emitting element 2R whose electron-transport layer 10 is replaced with the first electron-transport layer 16 in both the first region AL and the second region BL. Furthermore, the dashed lines represent characteristics of a red light-emitting element 2DR; that is, the above sub light-emitting element whose electron-transport layer 10 is replaced with the second electron-transport layer 18 in both the first region AL and the second region BL.

As described above, the lower-end level of the conduction band is shallower in the first electron-transport layer 16 than in the second electron-transport layer 18. The lower-end level of the conduction band in the first electron-transport layer 16 is close to the lower-end level of the conduction band in the light-emitting layer 12. Hence, the electrons are more likely to be injected from the first electron-transport layer 16, than from the second electron-transport layer 18, into the light-emitting layer 12 in a low electric field.

Hence, as FIG. 6 shows, V2 is higher than V1 where V1 represents the threshold voltage of the red light-emitting element 2CR, and V2 represents the threshold voltage of the red light-emitting element 2DR. Here, a typical threshold voltage of a light-emitting element does not depend on the area of the light-emitting element in plan view. Hence, V1 is the threshold voltage of the first red light-emitting element 2AR formed in the first region AL, and V2 is the threshold voltage of the second red light-emitting element 2BR formed in the second region BL. Thus, the threshold voltage of the first red light-emitting element 2AR is lower than the threshold voltage of the second red light-emitting element 2BR.

Meanwhile, ZnO contained in the second electron-transport layer 18 is lower in defective density and smaller in electric resistance than $Zn_{1-x}Mg_xO$ contained in the first electron-transport layer 16. Hence, compared with a light-emitting element including the layer typically containing $Zn_{1-x}Mg_xO$ as the electron-transport layer, a light-emitting element including the layer containing ZnO as the electron-transport layer tends to exhibit an increase in the current density of a current flowing when the same voltage is applied.

Hence, the rate of an increase in the current density to a rise in the applied voltage after the threshold voltage V2 in the red light-emitting element 2DR is higher than the rate of an increase in the current density to a rise in the applied voltage after the threshold voltage V1 in the red light-emitting element 2CR.

Here, typically, the rate of the increase in the current density to the rise in the applied voltage in a light-emitting element does not depend on the area of the light-emitting element in plan view. Hence, the rate of the increase in the current density to the rise in the applied voltage after the threshold voltage V1 is substantially equal between the first red light-emitting element 2AR and the red light-emitting element 2CR. Likewise, the rate of the increase in the current density to the rise in the applied voltage after the threshold voltage V2 is substantially equal between the second red light-emitting element 2BR and the red light-emitting element 2DR.

Hence, the variation of the current density with respect to the variation of the voltage is smaller in the first red light-emitting element 2AR than in the second red light-emitting element 2BR.

Here, in this embodiment, the first region AL is as large in area as the second region BL in plan view in one sub-pixel. In other words, in plan view, the area of each of the first red light-emitting element 2AR and the second red light-emitting element 2BR is half as large as the area of the red light-emitting element 2R.

As described above, in the red light-emitting element 2R, the first electron-transport layer 16R and the second electron-transport layer 18R share the cathode 6R; namely, a pixel electrode. Hence, when a voltage is applied to the red light-emitting element 2R according to this embodiment, the voltage is applied to both the first red light-emitting element 2AR including the first electron-transport layer 16R and the second red light-emitting element 2BR including the second electron-transport layer 18R.

However, the first red light-emitting element 2AR and the second red light-emitting element 2BR include respective electron-transport layers 10 made of different carrier-transport materials. That is why the first red light-emitting element 2AR and the second red light-emitting element 2BR are different in threshold voltage. Thus, specifically, when the voltage to be applied to the red light-emitting element 2R according to this embodiment reaches V1, only the first red light-emitting element 2AR including the first electron-transport layer 16 is driven.

Here, as described above, in plan view, the area of one first red light-emitting element 2AR is half as large as the area of one red light-emitting element 2R. Hence, from the threshold voltage V1 to the threshold voltage V2, the rate of the variation in the current density to the variation in the voltage in the red light-emitting element 2R according to this embodiment is half the rate of the variation in the current density to the variation in the voltage in the red light-emitting element 2CR. In other words, as illustrated in FIG. 6, when the threshold voltage V2 is applied, the current flowing in the red light-emitting element 2R has a current density of J1; whereas, the current flowing in the red light-emitting element 2CR has a current density of 2J1.

Moreover, when the voltage to be applied to the red light-emitting element 2R reaches V2, the second red light-emitting element 2BR is also driven. Hence, when the voltage is higher than the threshold voltage V2, the rate of the variation in the current density to the variation in the voltage in the red light-emitting element 2R is higher than the rate of the variation in the current density to the variation in the voltage in the red light-emitting element 2CR. Note that, as described above, in plan view, the area of one second red light-emitting element 2BR is half as large as the area of one red light-emitting element 2R. Hence, when the voltage is higher than the threshold voltage V2, the rate of the variation in the current density to the variation in the voltage in the red light-emitting element 2R is lower than the rate of the variation in the current density to the variation in the voltage in the red light-emitting element 2DR.

Next, attention is focused on the rate of the increase in the luminance of the red light-emitting element 2R to the increase in the current density of a current flowing in the red light-emitting element 2R. As seen in FIG. 7, the increase in the luminance in relation to the increase in the current density of a current flowing in the red light-emitting element 2DR is greater than the increase in the luminance in relation to the increase in the current density of a current flowing in the red light-emitting element 2CR.

As described above, ZnO contained in the second electron-transport layer 18 is smaller in electric resistance than $Zn_{1-x}Mg_xO$ contained in the first electron-transport layer 16. Hence, compared with a light-emitting element including a layer typically containing $Zn_{1-x}Mg_xO$ as the electron-transport layer, a light-emitting element including a layer containing ZnO as the electron-transport layer tends to exhibit an increase in the luminance at the same current density. In other words, the red light-emitting element 2DR is higher in light emission efficiency than the red light-emitting element 2CR when the currents flowing in the elements have the same current density.

Until the current density of the current flowing in the red light-emitting element 2R reaches J1, the light is emitted only from the first red light-emitting element 2AR. Here, typically, the light emission efficiency of a light-emitting element does not depend on an area of the light-emitting element in plan view. Hence, until the current density of the current flowing in the red light-emitting element 2R reaches J1, the rate of the increase in the luminance of the red light-emitting element 2R to the increase in the current density of the current flowing in the red light-emitting element 2R is substantially the same as the rate observed in the case of the red light-emitting element 2CR.

However, when the current density of the current flowing in the red light-emitting element 2R according to this embodiment exceeds J1, the light is emitted also from the second red light-emitting element 2BR. Hence, when the current density of the current flowing in the red light-emitting element 2R exceeds J1, the rate of the increase in the luminance of the red light-emitting element 2R to the increase in the current density of the current flowing in the red light-emitting element 2R is higher than the rate observed in the case of the red light-emitting element 2CR.

Here, FIG. 8 is a graph showing a case where the luminance of the red light-emitting element 2R according to this embodiment corresponds to the gradation value of a sub-pixel including the red light-emitting element 2R. As seen in FIG. 8, when the current density of the current flowing in the red light-emitting element 2R is up to J1, the variation in the gradation value of the sub-pixel including the red light-emitting element 2R is small in relation to the variation in the current density of the current flowing in the red light-emitting element 2R. Meanwhile, when the current density of the current flowing in the red light-emitting element 2R exceeds J1, the variation in the gradation value of the sub-pixel including the red light-emitting element 2R is large in relation to the variation in the current density of the current flowing in the red light-emitting element 2R.

Typically, when a sub-pixel including a light-emitting element is driven at low gradation, the current density of the current flowing in the light-emitting element is likely to vary. In this embodiment, however, in a low-gradation region, the variation in the gradation value of the sub-pixel including the red light-emitting element 2R is small in relation to the variation in the current density of the current flowing in the red light-emitting element 2R. Hence, the variation in the gradation value is also small in relation to the variation in the current density of the current flowing in the red light-emitting element 2R. Thus, this embodiment makes it possible to reduce the variation in the luminance and improve in gradation control, when the red light-emitting element 2R is driven at low gradation.

Moreover, in this embodiment, in a high gradation region, the variation in the gradation value of a sub-pixel including the red light-emitting element 2R is large in relation to the variation in the current density of the current flowing in the red light-emitting element 2R. In the high gradation region, such a feature makes it possible to reduce the current density required to obtain the same luminance. Thus, this embodiment makes it possible to reduce the voltage to be applied to the red light-emitting element 2R when the red light-emitting element 2R is driven at high gradation.

As can be seen, in a single red light-emitting element 2R of this embodiment, the light-emission characteristics of the red light-emitting element 2R can be easily changed. In particular, in this embodiment, the light-emission characteristics of the red light-emitting element 2R can be optimized at both the high gradation and the low gradation, without driving the red light-emitting element 2R by a plurality of sub-pixel circuits.

Note that the relationship of the characteristics between the red light-emitting element 2R, the red light-emitting element 2CR, and the red light-emitting element 2DR shown in FIGS. 6 to 8 is not due to the materials of the light-emitting layer 12 and the hole-transport layer 14. That is, the characteristics of the red light-emitting element 2R can be similarly applied to the green light-emitting element 2G and the blue light-emitting element 2B, except for the values of V1, V2, and J1, and for the value of the light emission efficiency. Hence, in this embodiment, the light-emission characteristics of the green light-emitting element 2G and the blue light-emitting element 2B can be further optimized at both the high gradation and the low gradation.

If the first electron-transport layer 16 contains $Zn_{1-x}Mg_xO$, the value x preferably ranges $0<x\leq0.4$ in order to further optimize the lower-end level of the conduction band of the first electron-transport layer 16. Moreover, the value x preferably ranges $0.1\leq x\leq0.2$ in order to optimize the lower-end level of the conduction band of the first electron-transport layer 16, and to further stabilize production of the material of the first electron-transport layer 16.

In this embodiment, the first electron-transport layer 16 contains, but not limited to, $Zn_{1-x}Mg_xO$, and the second electron-transport layer 18 contains, but not limited to, ZnO. For example, the first electron-transport layer 16 may contain TPBi instead of $Zn_{1-x}Mg_xO$.

For example, in a case where the electron-transport layer 10 of the red light-emitting element 2CR contains TPBi, the threshold voltage of the red light-emitting element 2CR is lower than the threshold voltage of the red light-emitting element 2DR. Moreover, the light emission efficiency of the red light-emitting element 2DR in relation to the same current density is higher than the light emission efficiency of the red light-emitting element 2CR in relation to the same current density.

Hence, also in a case where the first electron-transport layer 16 of the red light-emitting element 2R contains TPBi, the characteristics of the red light-emitting element 2R are shown by the solid lines in FIGS. 6 to 8. Thus, the light-emission characteristics of the red light-emitting element 2R can be further optimized at both high gradation and low gradation.

Note that, in this embodiment, in view of obtaining the above characteristics of the light-emitting element 2 more efficiently, the carrier density of the carrier-transport material of the first electron-transport layer 16 is preferably lower than the carrier density of the carrier-transport material of the second electron-transport layer 18.

The display device 1 including the above light-emitting element 2 can improve in gradation control without a plurality of sub-pixel circuits to be provided to a single sub-pixel on the array substrate 4. Specifically, the display device 1 can drive the light-emitting element 2 on low-gradation driving, so that variation in current density is large in relation to variation in gradation. Here, the low-gradation driving involves driving by a voltage lower than a threshold voltage of the sub light-emitting elements formed in the second region BL. Moreover, the display device 1 can drive the light-emitting element 2 on high-gradation driving, so that variation in current density is small in relation to variation in gradation. Here, the high-gradation driving involves driving by a voltage higher than, or equal to, a threshold voltage of the light-emitting elements formed in the second region BL.

Note that, in this embodiment, the display device 1 include, for example, but not limited to, a plurality of red sub-pixels, green sub-pixels, and glue sub-pixels. For example, the light-emitting element 2 may include any one of, or one each of, the red light-emitting element 2R, the green light-emitting element 2G, and the blue light-emitting element 2B. In such a case, the light-emitting element 2 is formed on the array substrate 4. Such a feature makes it possible to produce a light-emitting device including, for example, a light or a backlight unit.

Figure 9:
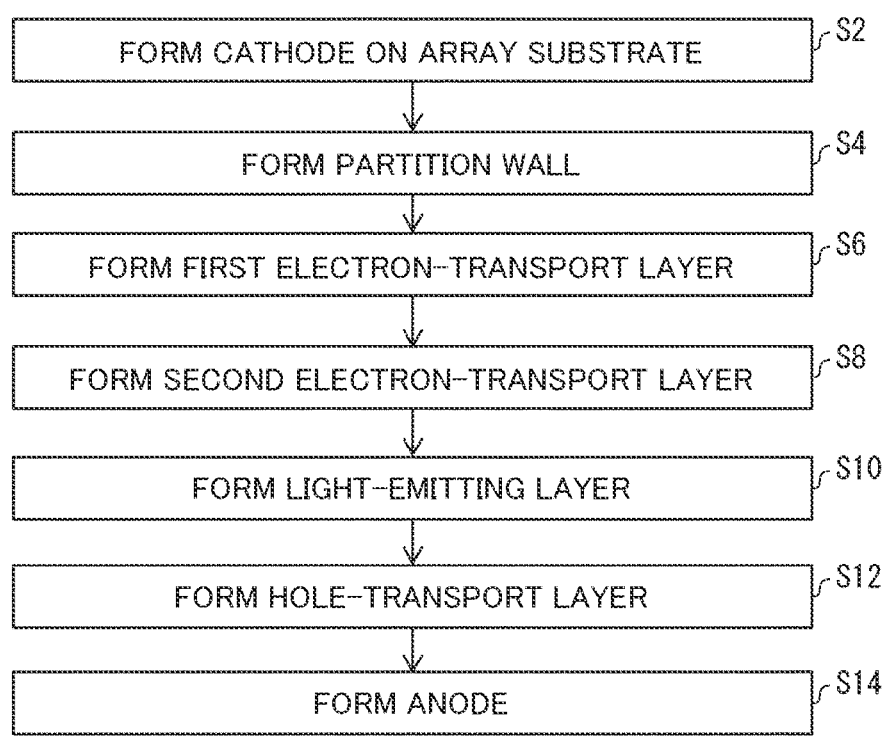
FIG. 9 is a flowchart showing steps of manufacturing the display device according to the first embodiment of the disclosure.

Described next with reference to FIGS. 9 to 13 is a method for manufacturing the display device 1 according to this embodiment. FIG. 9 is a flowchart showing a method for manufacturing the display device 1 according to this embodiment. Each of FIGS. 10 to 13 is a cross-sectional view showing steps of the method for manufacturing the display device 1 in FIG. 9. Each cross-sectional view corresponds in position to the cress-sectional view in FIG. 1.

Figure 10:
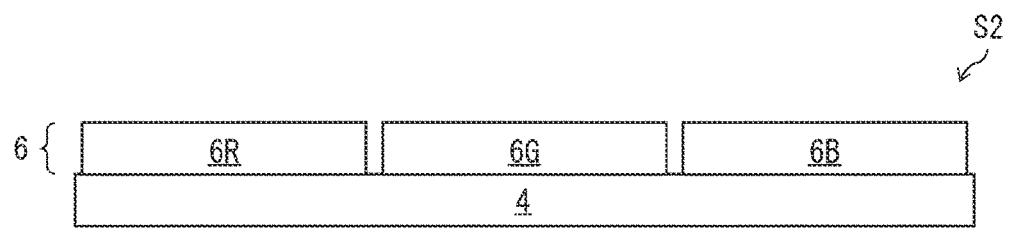
FIG. 10 illustrates cross-sectional views showing steps of manufacturing the display device according to the first embodiment of the disclosure.
Figure 10:
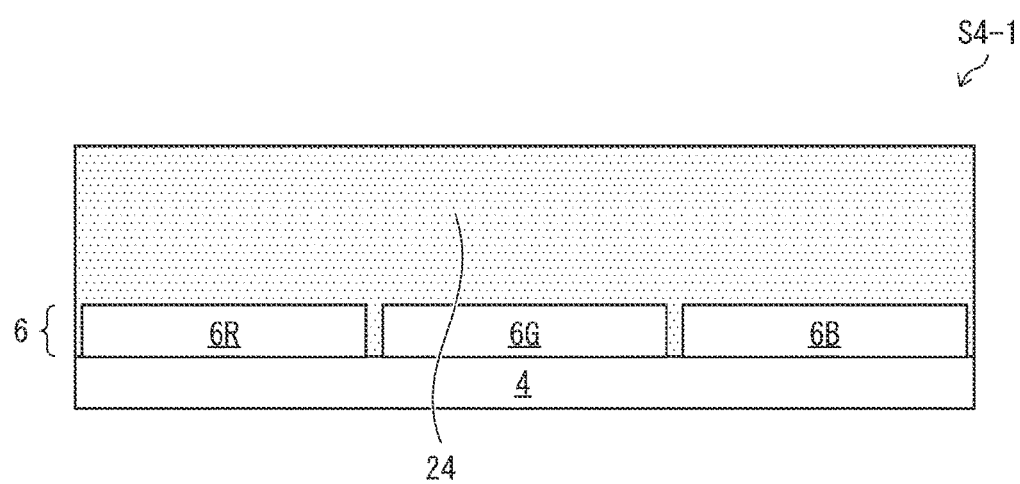
Figure 10:
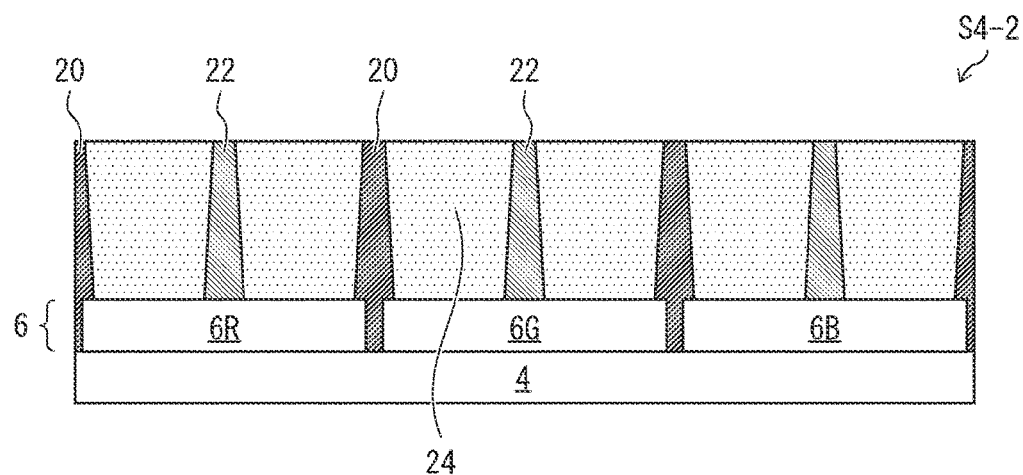
Figure 11:
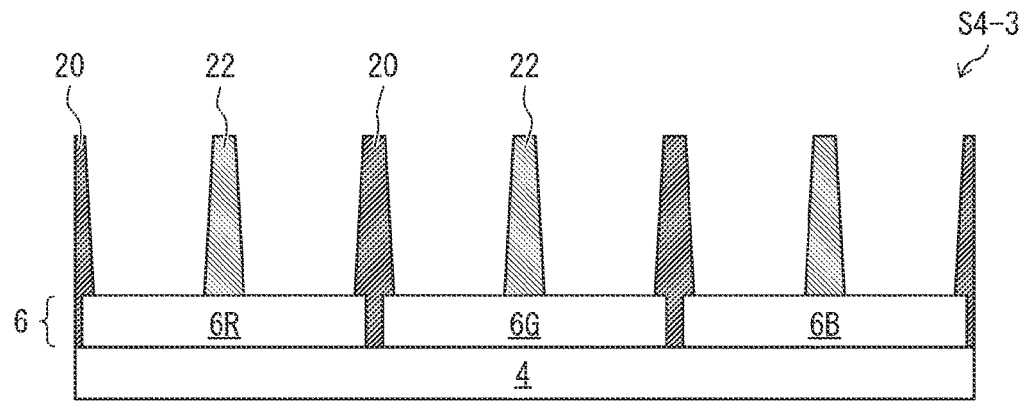
FIG. 11 illustrates other cross-sectional views showing steps of manufacturing the display device according to the first embodiment of the disclosure.
Figure 11:
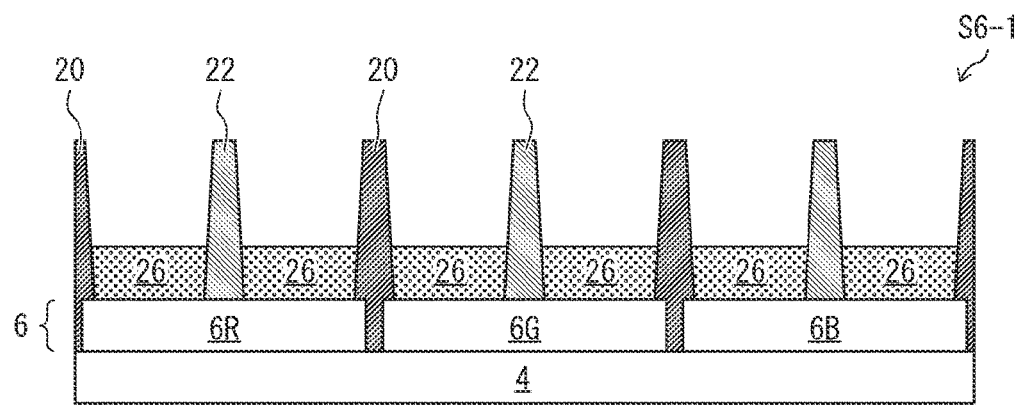
Figure 11:
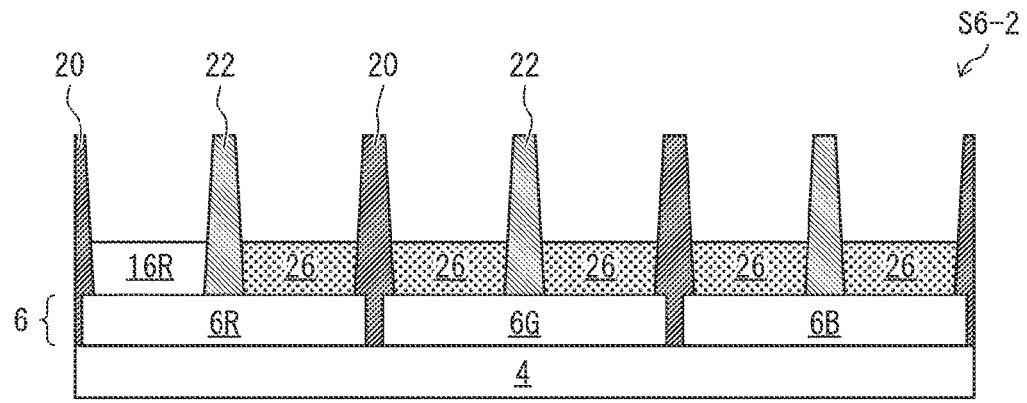
Figure 12:
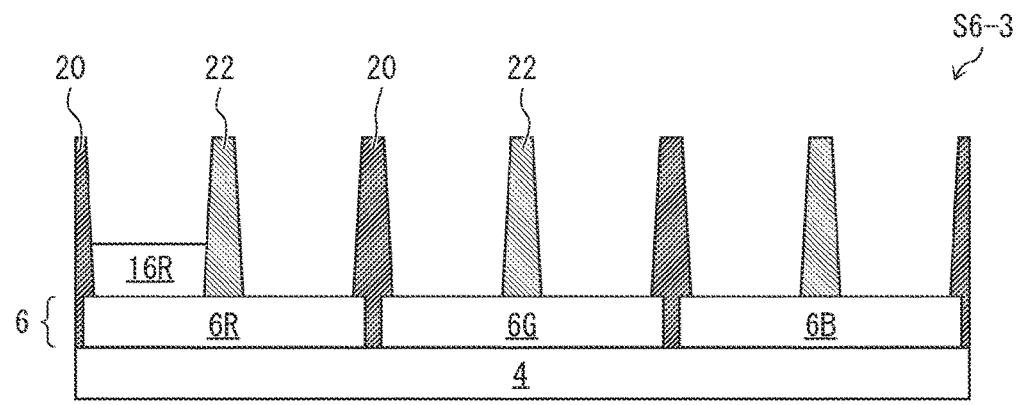
FIG. 12 illustrates still other cross-sectional views showing steps of manufacturing the display device according to the first embodiment of the disclosure.
Figure 12:
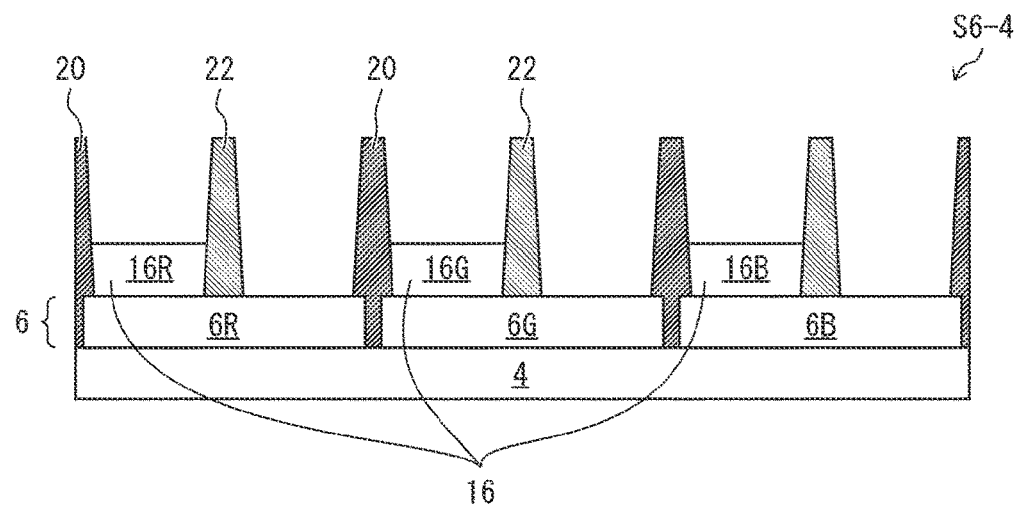
Figure 12:
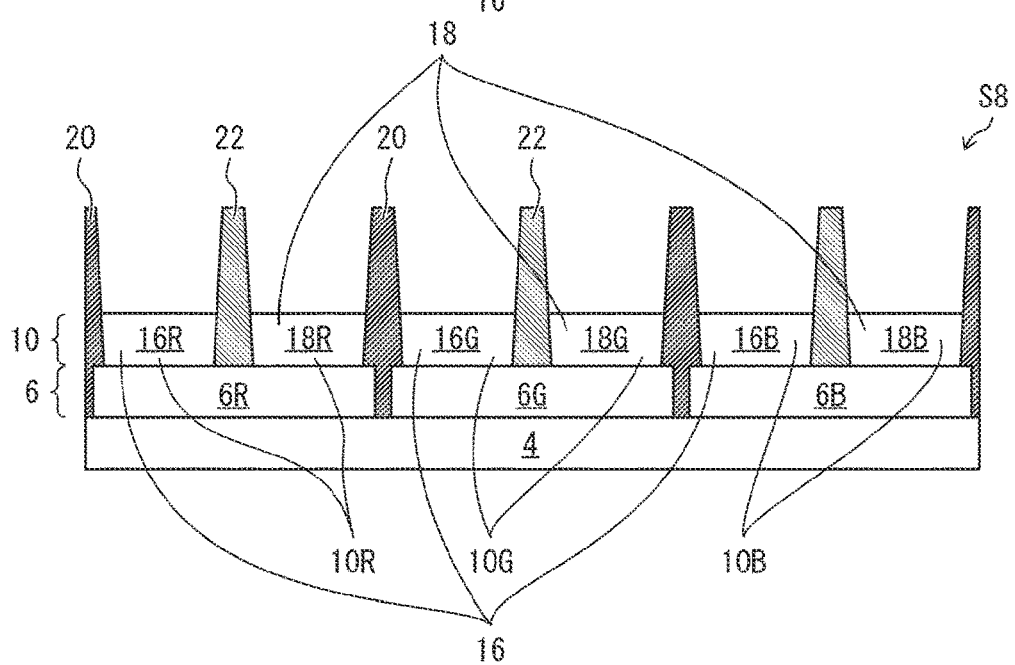
Figure 13:
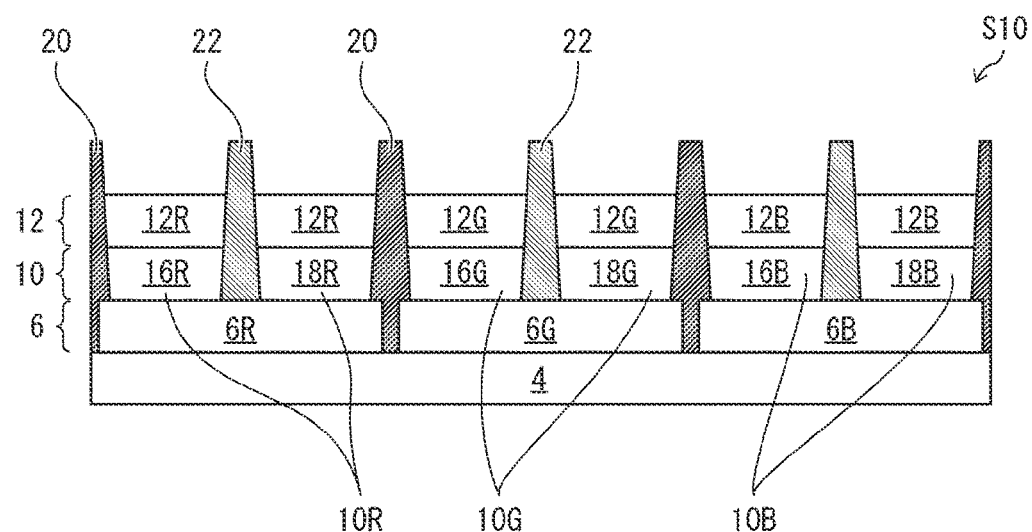
FIG. 13 illustrates still other cross-sectional views showing steps of manufacturing the display device according to the first embodiment of the disclosure.
Figure 13:
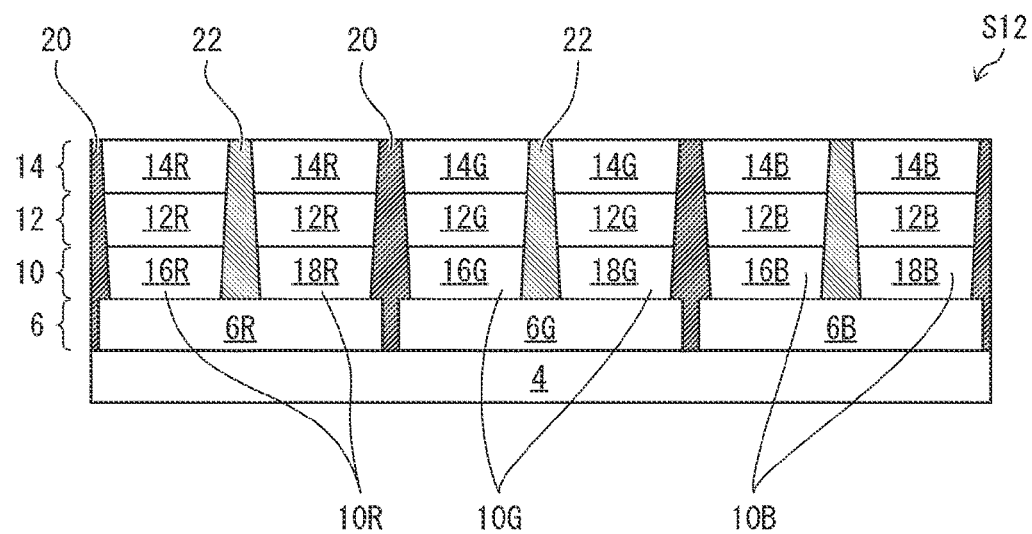

In the method for manufacturing the display device 1 according to this embodiment, first, at Step S2, the cathode 6 is formed on the array substrate 4 as illustrated in FIG. 10. The cathode 6 may be formed by a known technique. For example, a metal material may be deposited on the array substrate 4 by sputtering. After that, the deposited metal material may be patterned, using a photoresist. At Step S2, each cathode 6 is formed to electrically connect to a sub-pixel circuit formed on the array substrate 4.

At Step S4, the first partition walls 20 and the second partition walls 22 are formed. With a technique described as an example in this embodiment, the first partition walls 20 and the second partition walls 22 are formed in the same step.

At Step S4, for example, first, as seen in Step S4-1 in FIG. 10, a photosensitive resin 24 is applied to the array substrate 4 and the cathode 6. The photosensitive resin 24 is a material of the first partition walls 20 and the second partition walls 22. The photosensitive resin 24 may be, for example, a negative photosensitive resin.

Next, a photomask is placed above the photosensitive resin 24, and the photosensitive resin 24 is exposed to light. If the photosensitive resin 24 is negative, light-transparent portions of the photomask are placed in positions to overlap the positions in which the first partition walls 20 and the second partition walls 22 are formed. Hence, as seen at Step S4-2 in FIG. 10, the portions of the photosensitive resin 24 cure to become the first partition walls 20 and the second partition walls 22.

Next, the photosensitive resin 24 not exposed to light is rinsed with a liquid developer. Hence, only the first partition walls 20 and the second partition walls 22, which are cured by exposure to light, are left on the array substrate 4 and the cathode 6. Hence, as seen at Step S4-3 in FIG. 11, the first partition walls 20 and the second partition walls 22 are formed.

Note that a technique to form the first partition walls 20 and the second partition walls 22 shall not be limited to the above technique. Alternatively, the first partition walls 20 and the second partition walls 22 may be formed by vapor deposition, using a metal mask.

After Step S4, at Step S6, the first electron-transport layer 16 is formed. At Step S6, first, for example, as shown in Step S6-1 in FIG. 11, a photosensitive resin 26 is applied to the cathode 6. The photosensitive resin 26 contains a carrier-transport material of the first electron-transport layer 16R. In this embodiment, the photosensitive resin 26 contains, for example, a negative photosensitive material in addition to the carrier-transport material of the first electron-transport layer 16R.

Next, a photomask is placed above the photosensitive resin 26, and the photosensitive resin 26 is exposed to light. If the photosensitive resin 26 contains a negative photosensitive material, a light-transparent portion of the photomask is placed in a position to overlap the position in which the first electron-transport layer 16R is formed. Then, the photosensitive resin 26 is exposed to light. Hence, as seen at Step S6-2 in FIG. 11, the portion of the photosensitive resin 26 cures to become the first electron-transport layer 16R.

Next, the photosensitive resin 26 not exposed to light is rinsed with a liquid developer. Hence, only the first electron-transport layer 16R, which is cured by exposure to light, is left on the cathode 6R. Hence, as seen at Step S6-3 in FIG. 12, the first electron-transport layer 16R is formed.

Next, the photosensitive resin 26 is repeatedly applied, exposed to light, and rinsed, with appropriate changes of the carrier-transport materials contained in the photosensitive resin 26. Hence, as seen at Step S6-4 in FIG. 12, the first electron-transport layer 16G and the first electron-transport layer 16B are also formed by a technique similar to the above technique. Hence, as seen at Step S6-4 in FIG. 12, the first electron-transport layer 16 is formed.

Note that if all of the first electron-transport layer 16R, the first electron-transport layer 16G, and the first electron-transport layer 16B contain the same material, the application, the exposure to light, and the rinse of the photosensitive resin 26 may be each carried out once for forming the first electron-transport layer 16. Moreover, Step S6 may involve either applying the carrier-transport material by ink-jet printing, or vapor-depositing the carrier-transport material.

After Step S6, at Step S8, the second electron-transport layer 18 is formed. Step S8 may be carried out by the same technique as Step S6 is, except that, for example, the carrier-transport material contained in the photosensitive resin 26 is different.

After Step S8, at Step S10, the light-emitting layer 12 is formed. Step S10 may be carried out by the same technique as Steps S6 and S8 are, except that the carrier-transport material contained in the photosensitive resin 26 is a light-emitting material.

After Step S10, at Step S14, the hole-transport layer 14 is formed. Step S12 may be carried out by the same technique as Steps S6 and S8 are, except that, for example, the carrier-transport material contained in the photosensitive resin 26 is different.

Finally, at Step S14, the anode 8 is formed. Hence, the display device 1 in FIG. 1 is obtained. The anode 8 may be formed by a known technique. For example, the anode 8 may be made of such a light-transparent conductive material as ITO to be deposited on the hole-transport layer 14 by, for example, sputtering.

Second Embodiment

Figure 14:
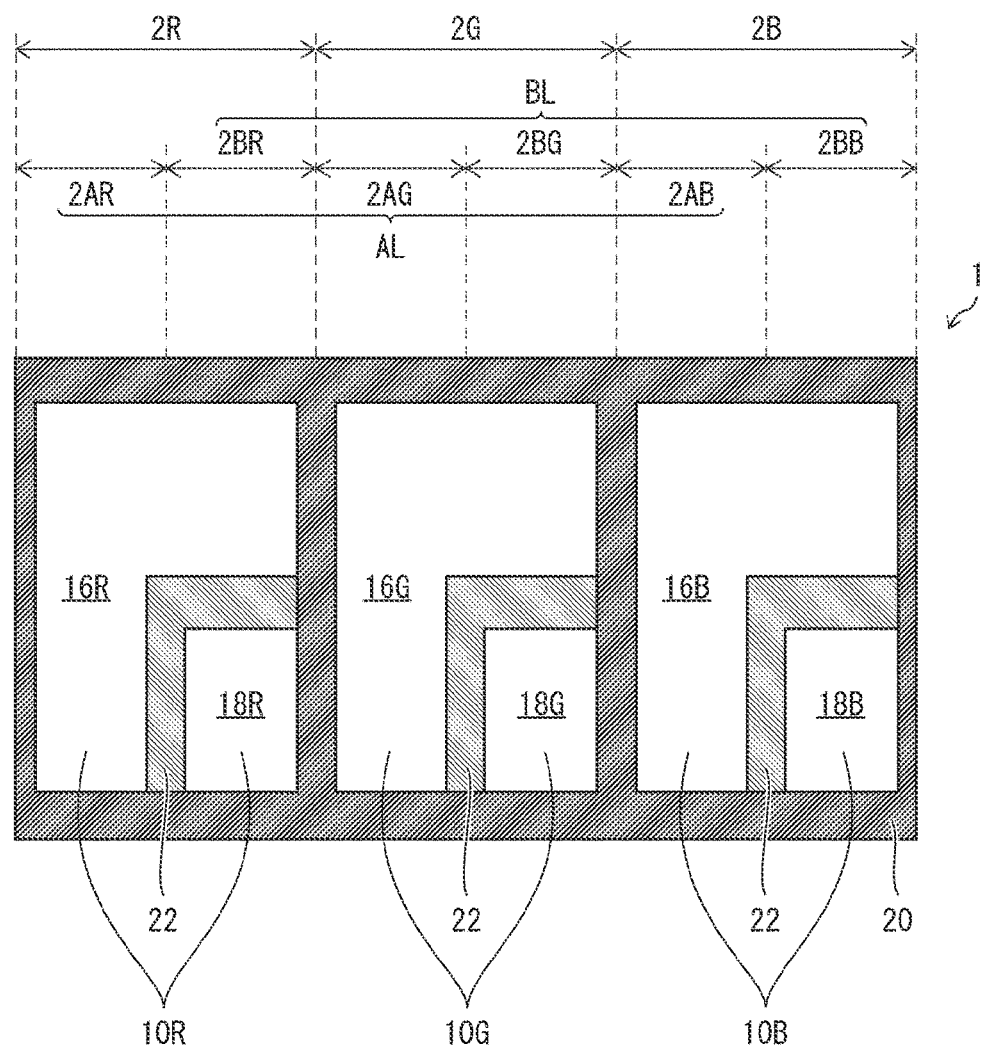
FIG. 14 is a schematic plan view of the display device according to a second embodiment of the disclosure.

FIG. 14 is a schematic plan view of the display device 1 according to this embodiment. The display device 1 according to this embodiment is the same in configuration as the display device 1 according to the first embodiment, except that the areal ratio of the first region AL to the second region BL is different between the display devices 1.

As illustrated in FIG. 14, in this embodiment, the area of the first region AL in plan view is larger than the area of the second region BL in plan view. In particular, in each sub light-emitting element of this embodiment, the area of the first region AL in plan view is larger than the area of the second region BL in plan view. For example, the area of the first red light-emitting element 2AR in plan view is larger than the area of the second red light-emitting element 2BR in plan view.

Modification

Figure 15:
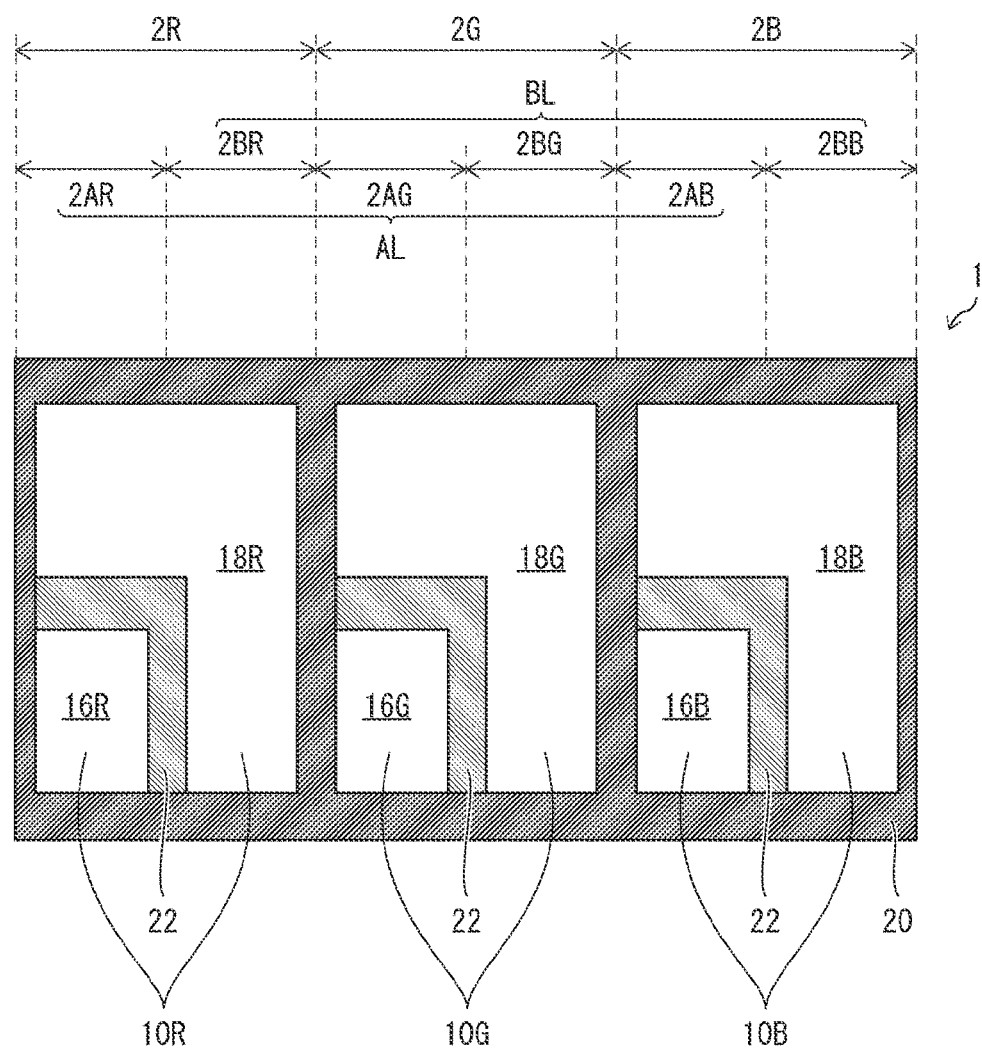
FIG. 15 is a schematic plan view of the display device according to a modification of the disclosure.

FIG. 15 is a schematic plan view of the display device 1 according to this modification. The display device 1 according to this modification is the same in configuration as the display device 1 according to the second embodiment, except that the areal ratio of first region AL to the second region BL is different between the display devices 1.

As illustrated in FIG. 15, in this modification, the area of the first region AL in plan view is smaller than the area of the second region BL in plan view. In particular, in each sub light-emitting element of this modification, the area of the first region AL in plan view is smaller than the area of the second region BL in plan view. For example, the area of the first red light-emitting element 2AR in plan view is smaller than the area of the second red light-emitting element 2BR in plan view.

The display devices 1 according to this embodiment and this modification can be manufactured by the same technique as the display device 1 according to the first embodiment is manufactured.

Figure 16:
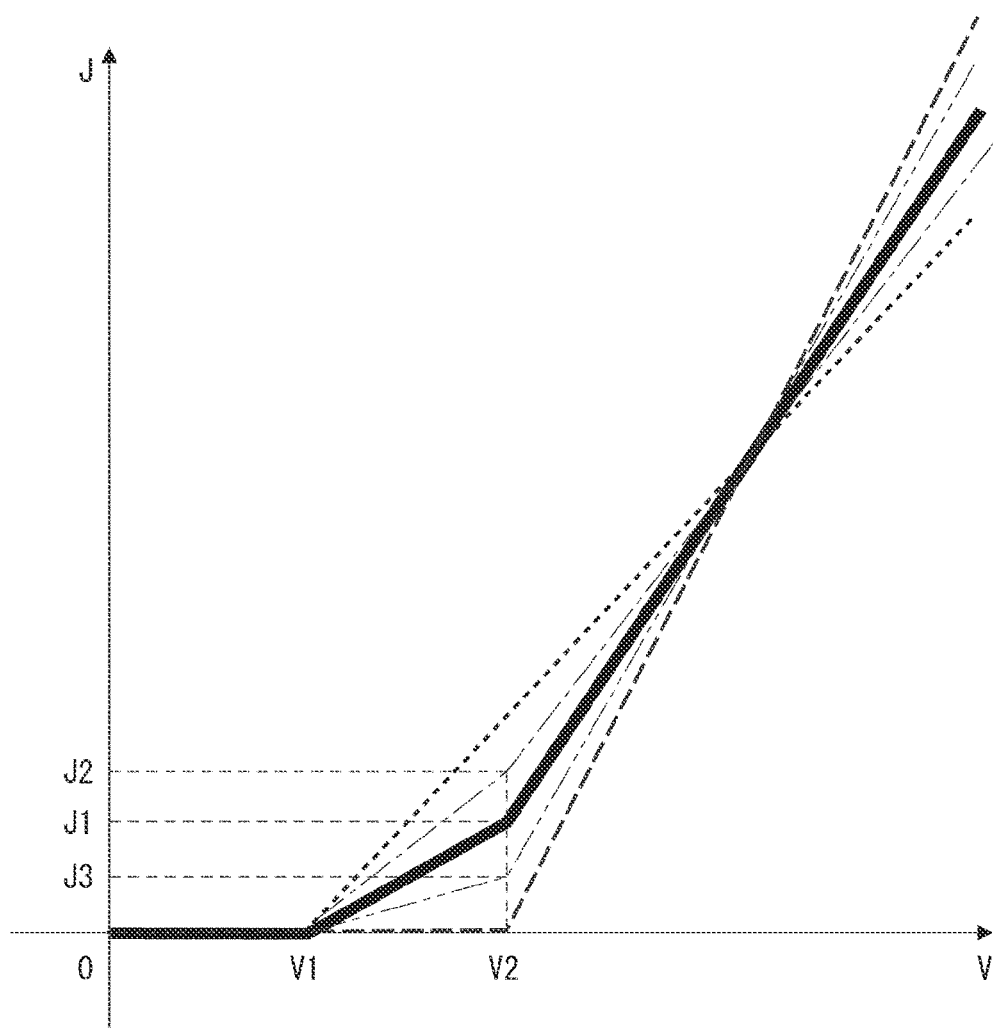
FIG. 16 is a graph illustrating a characteristic of the voltage and the current density of a light-emitting element according to each of the first to second embodiments and the modification of the disclosure.
Figure 17:
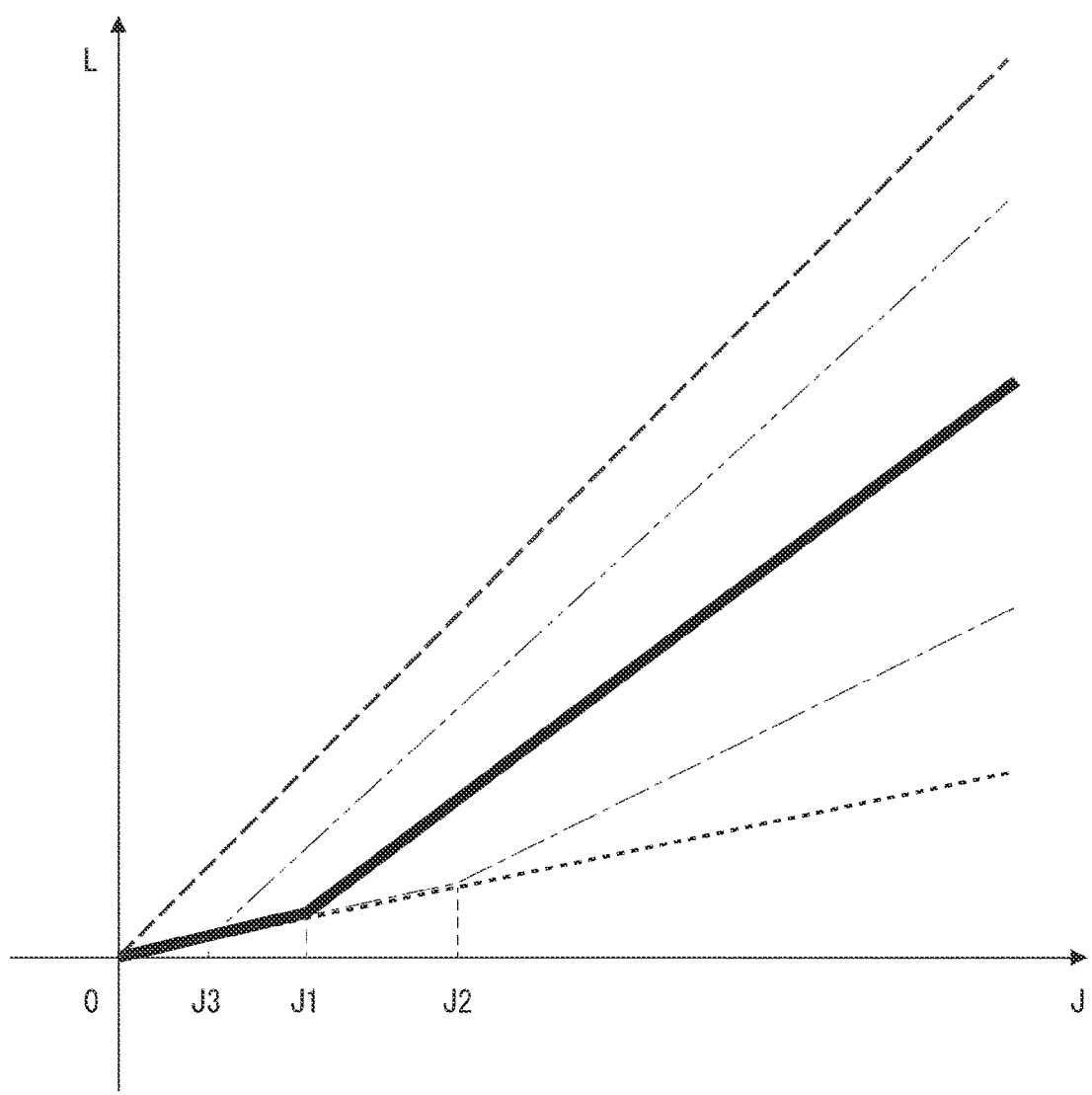
FIG. 17 is a graph illustrating a characteristic of the current density and the luminance of a light-emitting element according to each of the first to second embodiments and the modification of the disclosure.
Figure 18:
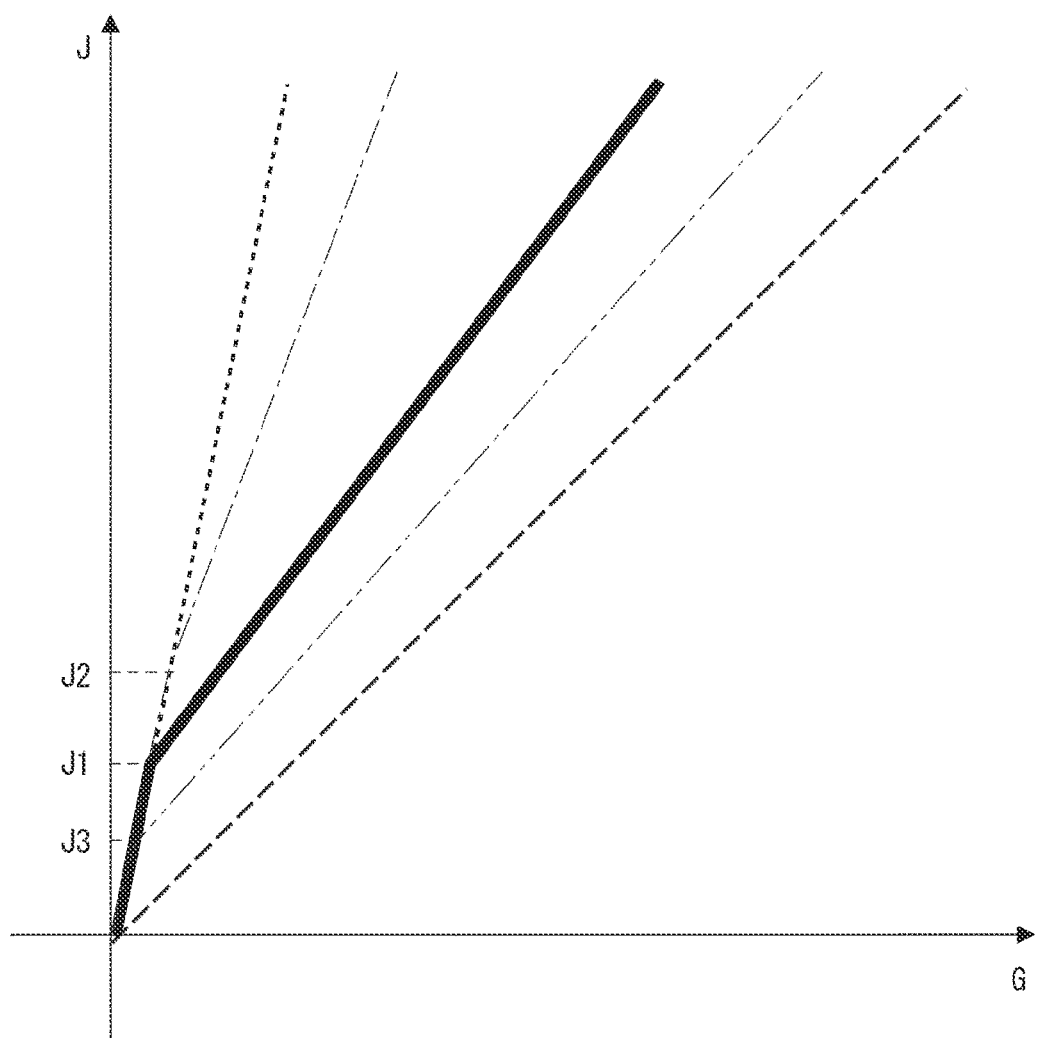
FIG. 18 is a graph illustrating a characteristic of the gradation value and the current density of a light-emitting element according to each of the first to second embodiments and the modification of the disclosure.

Described next with reference to FIGS. 16 to 18 are exemplary characteristics of the light-emitting element 2 according to this embodiment.

FIG. 16 is the graph in FIG. 6 additionally including characteristics of the red light-emitting element 2R according to this embodiment and this modification. FIG. 17 is the graph in FIG. 7 additionally including characteristics of the red light-emitting element 2R according to this embodiment and this modification. FIG. 18 is the graph in FIG. 8 additionally including characteristics of the red light-emitting element 2R according to this embodiment and this modification. In each of FIGS. 16 to 18, the dot-and-dash line shows a characteristic of the red light-emitting element 2R according to this embodiment, and the dash-dot-dot-dash line shows a characteristic of the light-emitting element 2R according to this modification.

As described above, a typical threshold voltage of a light-emitting element does not depend on an area of the light-emitting element in plan view. Hence, a threshold voltage of the first red light-emitting element 2AR according to this embodiment and this modification is V1, and a threshold voltage of the second red light-emitting element 2BR according to this embodiment and this modification is V2.

In one sub light-emitting element of this embodiment, the area of the first region AL is larger than the area of the second region BL in plan view. In other words, in plan view, the area of the first red light-emitting element 2AR is larger than the area of the second red light-emitting element 2BR.

Hence, as shown by the dot-and-dash line in FIG. 16, when the threshold voltage V2 of the red light-emitting element 2R according to this embodiment is applied, J2 is higher than J1 where J2 is the current density of a current flowing in the red light-emitting element 2R. In addition, when the threshold voltage is V2 or higher, the rate of a variation in the current density to a variation in the voltage in the red light-emitting element 2R according to this embodiment is lower than the rate of a variation in the current density to a variation in the voltage in the red light-emitting element 2R according to the first embodiment.

In one sub light-emitting element of this modification, the area of the first region AL is smaller than the area of the second region BL in plan view. In other words, in plan view, the area of the first red light-emitting element 2AR is smaller than the area of the second red light-emitting element 2BR.

Hence, as shown by the dash-dot-dot-dash line in FIG. 16, when the threshold voltage V2 of the red light-emitting element 2R according to this modification is applied, J3 is lower than J1 where J3 is the current density of a current flowing in the red light-emitting element 2R. In addition, when the threshold voltage is V2 or higher, the rate of a variation in the current density to a variation in the voltage in the red light-emitting element 2R according to this modification is higher than the rate of variation in the current density to variation in the voltage in the red light-emitting element 2R according to the first embodiment.

Moreover, as shown by the dot-and-dash line in FIG. 17, until the current density of the current flowing in the red light-emitting element 2R according to this embodiment reaches J2, the rate of an increase in the luminance of the red light-emitting element 2R to an increase in the current density is substantially the same as the rate observed in the case of the red light-emitting element 2CR. In addition, when the current density of the current flowing in the red light-emitting element 2R according to this embodiment exceeds J2, the rate of an increase in the luminance of the red light-emitting element 2R to an increase in the current density is in between the rate observed in the red light-emitting element 2CR and the rate observed in the red light-emitting element 2R according to the first embodiment.

Hence, as shown by the dot-and-dash line in FIG. 18, when the current density of the current flowing in the red light-emitting element 2R according to this embodiment is up to J2, the variation in the gradation value of a sub-pixel including the red light-emitting element 2R is small in relation to the variation in the current density. Meanwhile, when the current density of the current flowing in the red light-emitting element 2R according to this embodiment exceeds J2, the variation in the gradation value of a sub-pixel including the red light-emitting element 2R is large in relation to the variation in the current density. Note that, when the current density exceeds J2, the variation in the gradation value of a sub-pixel including the red light-emitting element 2R according to this embodiment is small in relation to the variation in the gradation value of a sub-pixel including the red light-emitting element 2R according to the first embodiment.

Moreover, as shown by the dash-dot-dot-dash line in FIG. 17, until the current density of the current flowing in the red light-emitting element 2R according to this modification reaches J3, the rate of an increase in the luminance of the red light-emitting element 2R to an increase in the current density is substantially the same as the rate observed in the red light-emitting element 2CR. In addition, when the current density of the current flowing in the red light-emitting element 2R according to this modification exceeds J3, the rate of an increase in the luminance of the red light-emitting element 2R to an increase in the current density is in between the rate observed in the red light-emitting element 2DR and the rate observed in the red light-emitting element 2R according to the first embodiment.

Hence, as shown by the dash-dot-dot-dash line in FIG. 18, when the current density of the current flowing in the red light-emitting element 2R according to this modification is up to J3, the variation in the gradation value of a sub-pixel including the red light-emitting element 2R is small in relation to the variation in the current density. Meanwhile, when the current density of the current flowing in the red light-emitting element 2R according to this modification exceeds J3, the variation in the gradation value of a sub-pixel including the red light-emitting element 2R is large in relation to the variation in the current density. Note that, when the current density exceeds J3, the variation in the gradation value of a sub-pixel including the red light-emitting element 2R according to this modification is large in relation to the variation in the gradation value of a sub-pixel including the red light-emitting element 2R according to the first embodiment.

Note that the relationship of the characteristics among the red light-emitting elements 2R shown in FIGS. 16 to 18 is not due to the materials of the light-emitting layer 12 and the hole-transport layer 14. That is, in this embodiment and this modification, the characteristics of the red light-emitting elements 2R can be similarly applied to the green light-emitting element 2G and the blue light-emitting element 2B, except for the values of V1, V2, J2, and J3, and the value of the light emission efficiency.

In the light-emitting element 2 according to this embodiment, the low-gradation region, in which the variation in the gradation value of the sub-pixels is small, is applied up to a higher greyscale. Hence, even if a larger variation of current density is observed in a low-gradation region, the light-emitting element 2 according to this embodiment can reduce variation in luminance and improve in gradation control.

Meanwhile, the light-emitting element 2 according to this modification can increase variation in the gradation value of each of the sub-pixels in relation to variation in current density, in a high-gradation region in which the variation in the gradation value of each of the sub-pixels is large in relation to the variation in the current density. Hence, the light-emitting element 2 according to this modification can decrease the current density required to obtain the same luminance. When the light-emitting element 2 is driven at high gradation, the voltage to be applied to the light-emitting element 2 can be further reduced.

As can be seen, compared with the display device 1 according to the first embodiment, the display device 1 including the light-emitting element 2 according to this embodiment can improve, more efficiently, in gradation control in a low-gradation region. Moreover, compared with the display device 1 according to the first embodiment, the display device 1 including the light-emitting element 2 according to this modification can improve, more efficiently, in gradation control in a high-gradation region.

In view of more efficient improvement in the gradation control in a low-gradation region, in this embodiment, the first region AL is three times as large in area as the second region BL or larger in plan view. Moreover, in view of ensuring advantageous effects of improvement in the gradation control in a high-gradation region, in this embodiment, the first region AL is five times as large in area as the second region BL or smaller in plan view.

In view of more efficient improvement in the gradation control in a high-gradation region, in this modification, the second region BL is three time as large in area as the first region AL or larger in plan view. Moreover, in view of ensuring advantageous effects of improvement in the gradation control in a low-gradation region, in this embodiment, the second region BL is five times as large in area as the first region AL or smaller in plan view.

Third Embodiment

Figure 19:
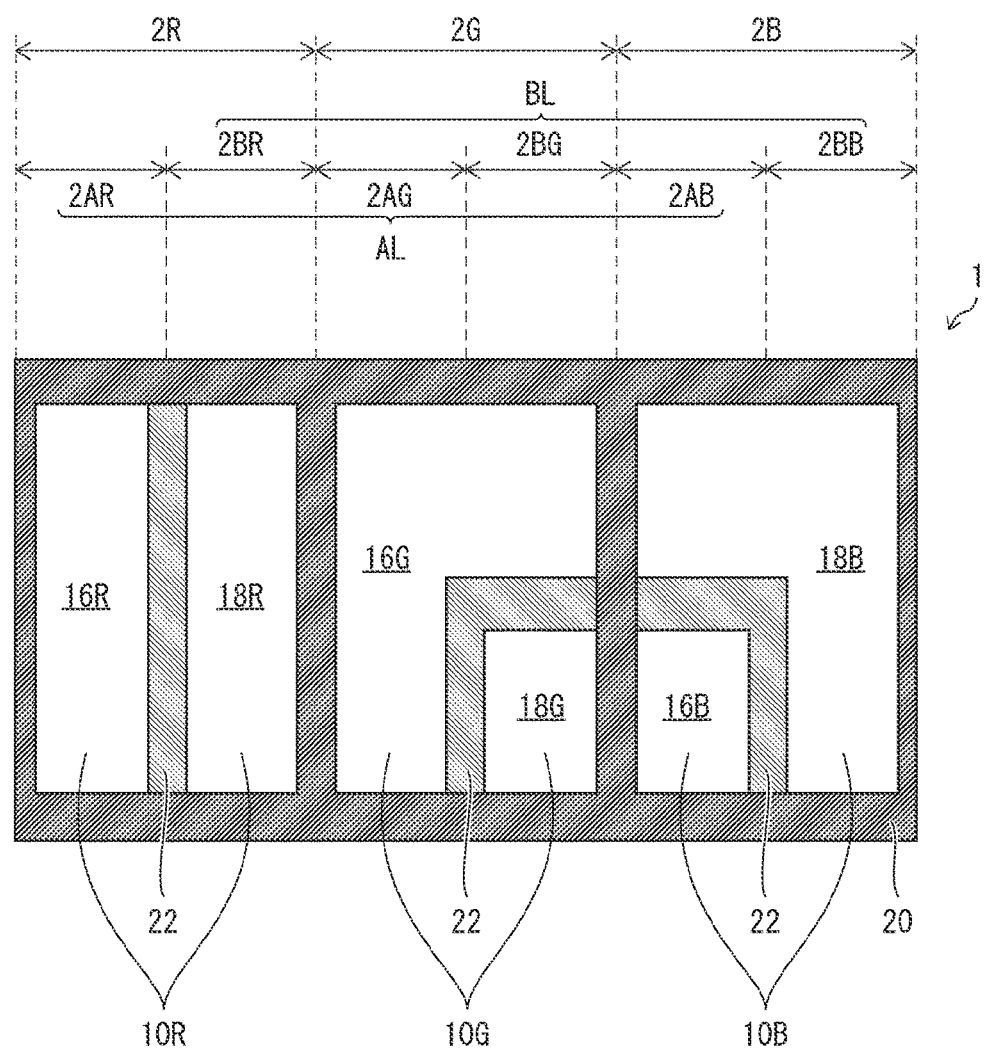
FIG. 19 is a schematic plan view of the display device according to a third embodiment of the disclosure.

FIG. 19 is a schematic plan view of the display device 1 according to this embodiment. In the display device 1 according to this embodiment, the areal ratio of the first region AL to the second region BL in plan view is different between the red light-emitting element 2R, the green light-emitting element 2G, and the blue light-emitting element 2B. Other than the above feature, the display device 1 according to this embodiment is the same in configuration as the display devices 1 according to the above embodiments.

In the red light-emitting element 2R in FIG. 19 according to this embodiment, in plan view, the first region AL is as large in area as the second region BL. In other words, in this embodiment, the area of the first red light-emitting element 2AR in plan view is as large as the area of the second red light-emitting element 2BR in plan view.

In contrast, as illustrated in FIG. 19, in the green light-emitting element 2G according to this embodiment, the first region AL is larger in area than the second region BL in plan view. In other words, in this embodiment, the area of the first green light-emitting element 2AG in plan view is larger than the area of the second green light-emitting element 2BG in plan view.

Moreover, as illustrated in FIG. 19, in the blue light-emitting element 2B according to this embodiment, the first region AL is larger in area than the second region BL in plan view. In other words, in this embodiment, the area of the first blue light-emitting element 2AB in plan view is larger than the area of the second blue light-emitting element 2BB in plan view.

Typically, the visual sensitivity of humans is higher to green light than to red light and blue light. Hence, the variation in luminance in a low-gradation region is more apparent to the green light-emitting element 2G than to the red light-emitting element 2R and the blue light-emitting element 2B.

In this embodiment, the area of the first green light-emitting element 2AG in plan view is larger than the area of the second green light-emitting element 2BG in plan view. Such a feature can more efficiently reduce luminance variation in a low-gradation region of the green light-emitting element 2G, the luminance variation being more apparent than the luminance variation of the red light-emitting element 2R and the blue light-emitting element 2B.

Moreover, typically, the light emission efficiency of a light-emitting element emitting blue light is lower than the light emission efficiency of light-emitting elements each emitting red light and green light. Hence, in a high-gradation region, the luminance of the blue light-emitting element 2B is lower than the luminance of the red light-emitting element 2R and the green light-emitting element 2G when the current density is the same.

In this embodiment, the area of the first blue light-emitting element 2AB in plan view is smaller than the area of the second blue light-emitting element 2BB in plan view. Such a feature can more efficiently improve luminance of the blue light-emitting element 2B in a high-gradation region. The luminance of the blue light-emitting element 2B is lower than the luminance of the red light-emitting element 2R and the green light-emitting element 2G.

As can be seen, the display device 1 including the light-emitting element 2 according to this embodiment can more efficiently improve in gradation control of the sub light-emitting elements, depending on colors of light emitted from the sub light-emitting elements.

The display device 1 according to this embodiment can be manufactured by the same technique as the display devices 1 according to the above embodiments are.

Fourth Embodiment

Figure 20:
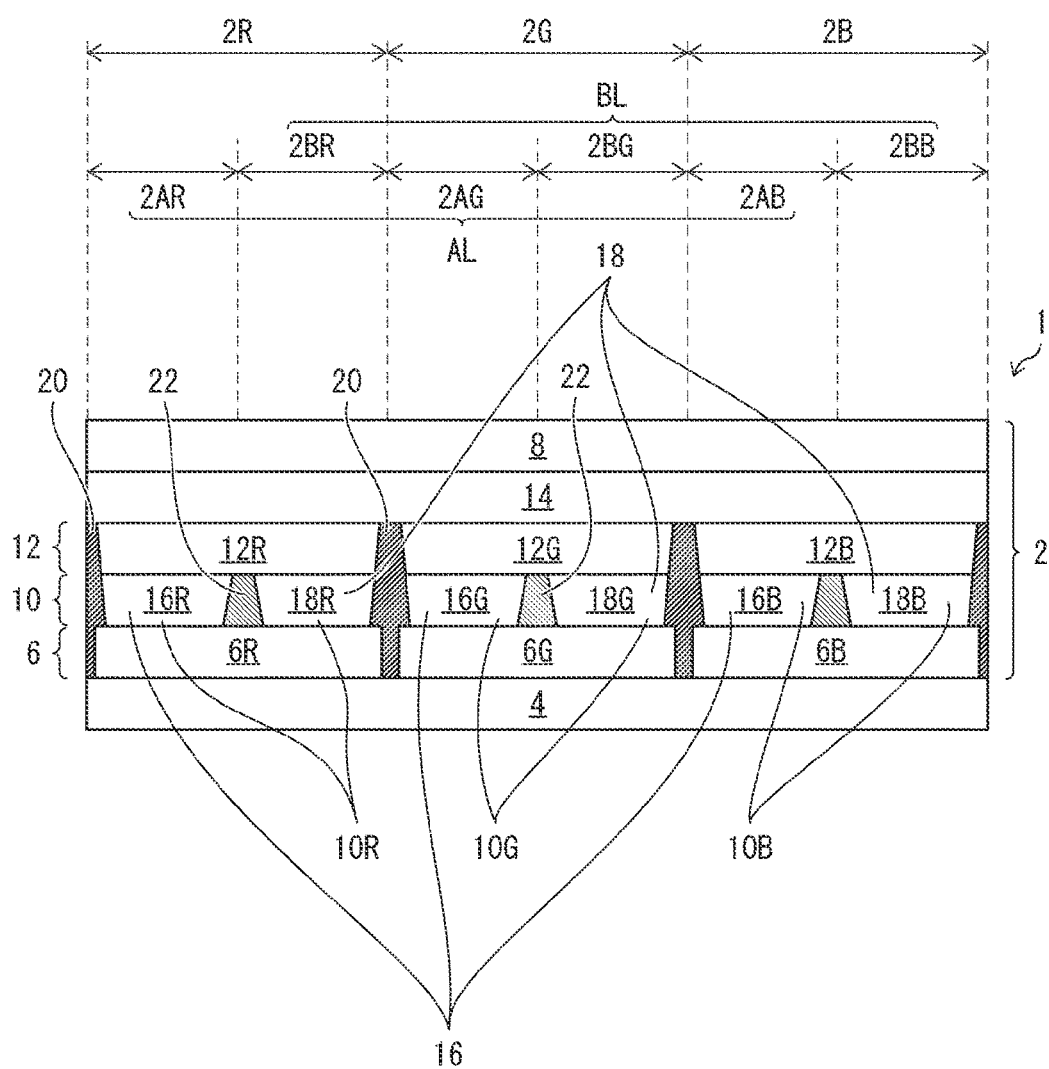
FIG. 20 is a schematic cross-sectional view of the display device according to a fourth embodiment of the disclosure.

FIG. 20 is a schematic cross-sectional view of the display device 1 according to this embodiment. The cross-sectional view corresponds in position to the cross-sectional view in FIG. 1. In this embodiment, the first partition walls 20 partition only the cathode 6, the electron-transport layer 10, and the light-emitting layer 12 into the sub light-emitting elements. Moreover, in this embodiment, the second partition walls 22 partition only the electron-transport layer 10 into the first electron-transport layer 16 and the second electron-transport layer 18 in each of the sub light-emitting elements.

Hence, the red light-emitting layer 12R is in common between the first red light-emitting element 2AR and the second red light-emitting element 2BR. Likewise, the green light-emitting layer 12G is in common between the first green light-emitting element 2AG and the second green light-emitting element 2BG. Moreover, the blue light-emitting layer 12B is in common between the first blue light-emitting element 2AB and the second blue light-emitting element 2BB. Furthermore, the hole-transport layer 14 is in common between the red light-emitting element 2R, the green light-emitting element 2G, and the blue light-emitting element 2B.

Other than the above features, the display device 1 according to this embodiment is the same in configuration as the display devices 1 according to the above embodiments.

As seen in the case of the display devices 1 according to the above embodiments, the display device 1 according to this embodiment can improve in gradation control without a plurality of sub-pixel circuits provided to a single sub-pixel on the array substrate 4. Moreover, compared with the first partition walls 20 and the second partition walls 22 according to the above embodiments, the first partition walls 20 and the second partition walls 22 according to this embodiment can be formed in low height. Such a feature makes it possible to reduce a material of the first partition walls 20 and the second partition walls 22, and lower production costs. Moreover, this embodiment can simplify steps of forming the first partition walls 20 and the second partition walls 22.

In steps of producing the display device 1 according to this embodiment, the first partition walls 20 and the second partition walls 21 may be formed by one-time photolithography. For example, the first partition walls 20 and the second partition walls 22 according to this embodiment can be formed by one-time photolithography at above Step S4, using a halftone photomask including semi light-transparent portions whose light transparency is in between the light transparency of the light-transparent portions and the light-shielding portions. Other than the above step, the display device 1 according to this embodiment can be manufactured by the same technique as the display devices 1 according to the above embodiments are.

Figure 21:
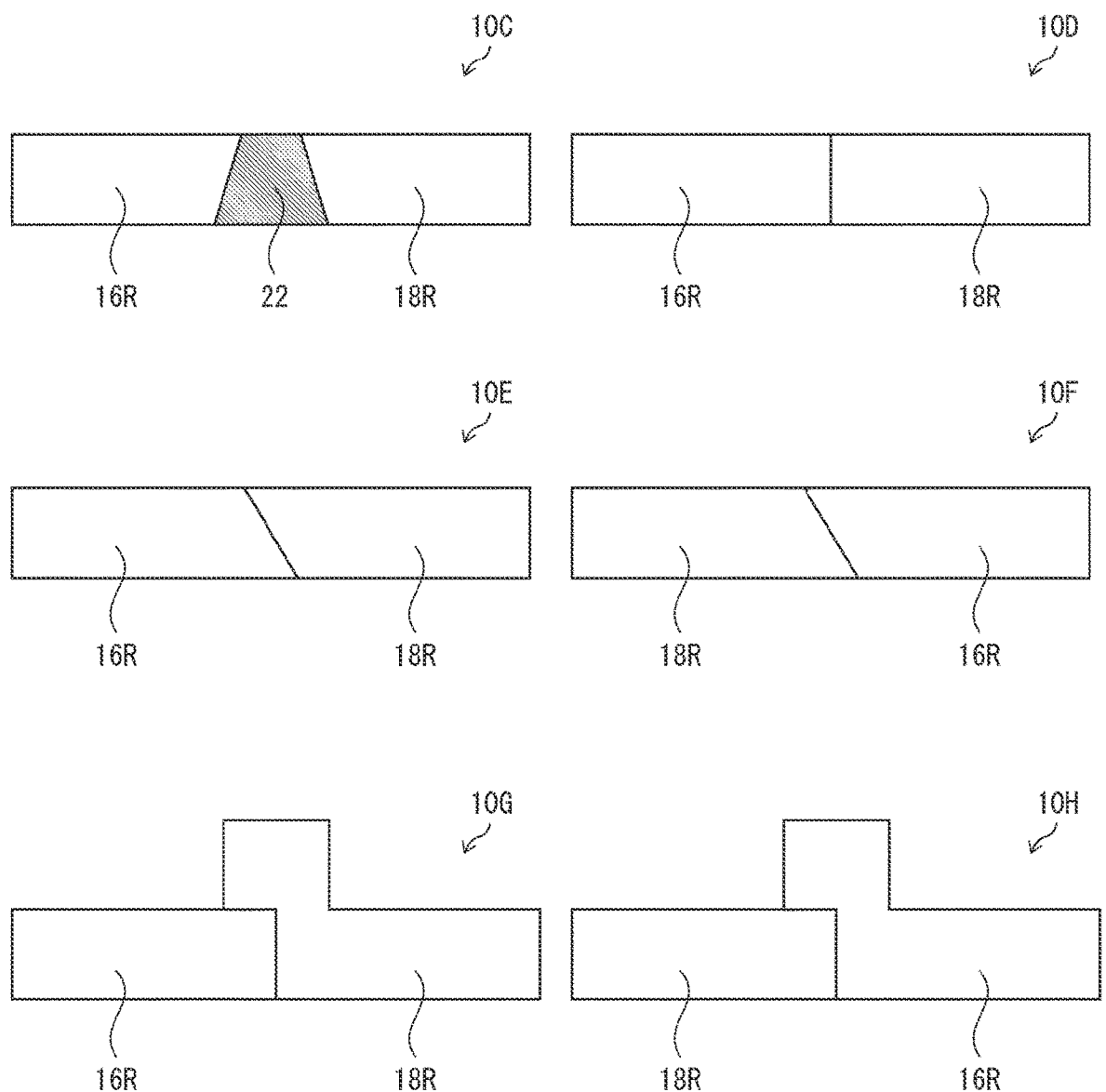
FIG. 21 schematically illustrates exemplary shapes of an electron-transport layer according to each of the embodiments of the disclosure.

FIG. 21 schematically illustrates exemplary and specific shapes of the first electron-transport layer 16R and the second electron-transport layer 18R according to each of the above embodiments, presenting exemplary and specific shapes of the electron-transport layer 10R. Note that the exemplary and specific shapes of the electron-transport layer 10R in FIG. 21 can be applied to the electron-transport layer 10G included in the green light-emitting element 2G and the electron-transport layer 10B included in the blue light-emitting element 2B.

As seen in the electron-transport layer 10C in FIG. 21, the first electron-transport layer 16R and the second electron-transport layer 18R may be separated with a second partition wall 22 described above. Such a feature improves electrical insulation, and reduces cross-talk, between the first red light-emitting element 2AR including the first electron-transport layer 16R and the second red light-emitting element 2BR including the second electron-transport layer 18R.

Meanwhile, as seen in the electron-transport layer 10D in FIG. 21, the first electron-transport layer 16R and the second electron-transport layer 18R may be in contact with each other. Such a feature can omit a step to form the second partition walls 22 in the steps of manufacturing the display device 1, making it possible to simplify the steps of producing the display device 1, and to reduce production costs.

Moreover, when the first electron-transport layer 16R and the second electron-transport layer 18R are in contact with each other, the contact face between the first electron-transport layer 16R and the second electron-transport layer 18R does not have to be orthogonal to the planar direction of the display device 1. For example, as seen in the electron-transport layer 10E and the electron-transport layer 10F in FIG. 21, the contact face between the first electron-transport layer 16R and the second electron-transport layer 18R may be angled to the planar direction of the display device 1.

Here, as seen in the electron-transport layer 10E in FIG. 21, on the contact face between the first electron-transport layer 16R and the second electron-transport layer 18R, the second electron-transport layer 18R may be positioned above the first electron-transport layer 16R. In contrast, as seen in the electron-transport layer 10F in FIG. 21, on the contact face between the first electron-transport layer 16R and the second electron-transport layer 18R, the first electron-transport layer 16R may be positioned above the second electron-transport layer 18R.

Moreover, as seen in the electron-transport layers 10G and 10H in FIG. 21, one of the first electron-transport layer 16R or the second electron-transport layer 18R may be partially overlap a top face of the other.

In such a case, the red light-emitting element 2R increases in thickness in the position where the first electron-transport layer 16R and the second electron-transport layer 18R overlap each other. Hence, the element resistance of the red light-emitting element 2R increases. Thus, a current cannot run very well in the position where the first electron-transport layer 16R and the second electron-transport layer 18R overlap each other. Hence, even if the second partition walls 22 are not formed, such a feature improves electrical insulation, and reduces cross-talk, between the first red light-emitting element 2AR including the first electron-transport layer 16R and the second red light-emitting element 2BR including the second electron-transport layer 18R.

Here, as seen in the electron-transport layer 10G in FIG. 21, in a position where the first electron-transport layer 16R and the second electron-transport layer 18R overlap each other, the second electron-transport layer 18R may be positioned above the first electron-transport layer 16R. In contrast, as seen in the electron-transport layer 10H in FIG. 21, in a position where the first electron-transport layer 16R and the second electron-transport layer 18R overlap each other, the second electron-transport layer 16R may be positioned above the first electron-transport layer 18R.

Fifth Embodiment

Figure 22:
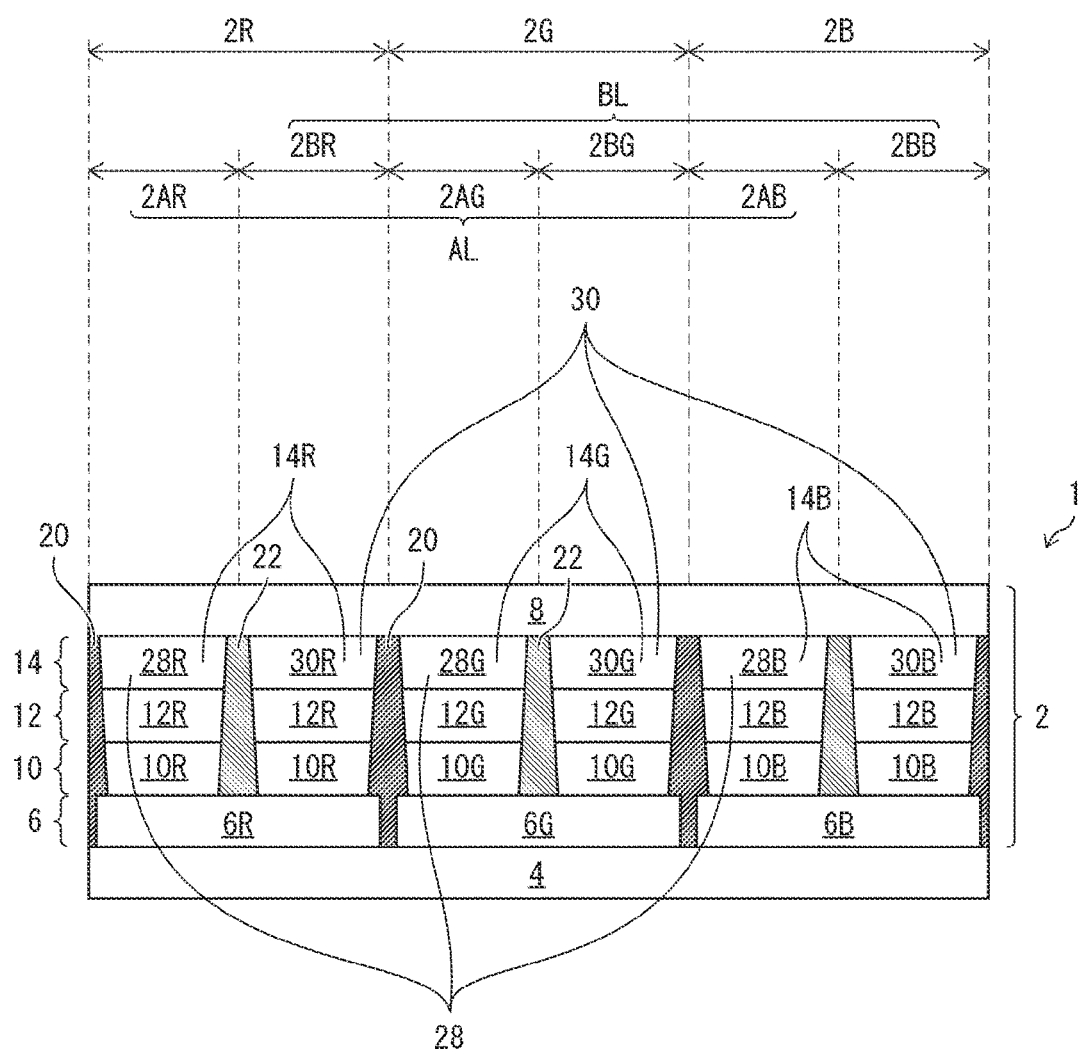
FIG. 22 is a schematic cross-sectional view of the display device according to a fifth embodiment of the disclosure.

FIG. 22 is a schematic cross-sectional view of the display device 1 according to this embodiment. The cross-sectional view corresponds in position to the cross-sectional view in FIG. 1.

In this embodiment, the electron-transport layer 10 includes: the electron-transport layer 10R for a red sub-pixel; the electron-transport layer 10G for a green sub-pixel; and the electron-transport layer 10B for a blue sub-pixel. In this embodiment, the electron-transport layer 10R is formed in both the first region AL and the second region BL of the red light-emitting element 2R. Moreover, in this embodiment, the electron-transport layer 10G is formed in both the first region AL and the second region BL of the green light-emitting element 2G. Furthermore, in this embodiment, the electron-transport layer 10B is formed in both the first region AL and the second region BL of the blue light-emitting element 2B.

In the hole-transport layer 14 according to this embodiment, the first region AL and the second region BL in each of the sub light-emitting elements contain different carrier-transport materials from each other. Specifically, in the hole-transport layer 14, the first region AL includes a first hole-transport layer 28 as a first charge-transport layer, and the second region BL includes a second hole-transport layer 30 as a second charge-transport layer.

The first hole-transport layer 28 includes: a first hole-transport layer 28R formed in the first red light-emitting element 2AR; a first hole-transport layer 28G formed in the first green light-emitting element 2AG; and a first hole-transport layer 28B formed in the first blue light-emitting element 2AB. Moreover, the second hole-transport layer 30 includes: a second hole-transport layer 30R formed in the second red light-emitting element 2BR; a second hole-transport layer 30G formed in the second green light-emitting element 2BG; and a second hole-transport layer 30B formed in the second blue light-emitting element 2BB.

Hence, in the red light-emitting element 2R, the first hole-transport layer 28R and the second hole-transport layer 30R share the cathode 6R, namely, a pixel electrode. Likewise, in the green light-emitting element 2G, the first hole-transport layer 28G and the second hole-transport layer 30G share the cathode 6G, namely, a pixel electrode. Moreover, in the blue light-emitting element 2B, the first hole-transport layer 28B and the second hole-transport layer 30B share the cathode 6B, namely, a pixel electrode.

Note that the first hole-transport layer 28R, the first hole-transport layer 28G, and the first hole-transport layer 28B may contain the same carrier-transport material, or different carrier-transport materials from one another. Likewise, the second hole-transport layer 30R, the second hole-transport layer 30G, and the second hole-transport layer 30B may contain the same carrier-transport material, or different carrier-transport materials from one another. Moreover, the hole-transport layer 14R, the hole-transport layer 14G, and the hole-transport layer 14B may contain the same carrier-transport material, or different carrier-transport materials from one another.

Other than the above features, the display device 1 according to this embodiment is the same in configuration as the display device 1 according to the first embodiment.

As seen in the case of the display device 1 according to the first embodiment, the display device 1 according to this embodiment can improve in gradation control without a plurality of sub-pixel circuits provided to a single sub-pixel on the array substrate 4.

In this embodiment, the electron-transport layer 10 may be formed after Step S4 in FIG. 9 by the same technique used at Step S12, instead of Steps S6 and S8. Moreover, the hole-transport layer 14 may be formed after Step S10 in FIG. 9 by the same techniques used at Steps S6 and S8, instead of Step S12. Other than the above steps, the display device 1 according to this embodiment can be produced by the same technique as the display devices 1 according to the above embodiments are.

Note that, in this embodiment, the electron-transport layer 10 is separated with the first partition walls 20 and the second partition walls 22. However, the electron-transport layer 10 may be formed in any given configuration. For example, the electron-transport layer 10 may be formed in common with the red light-emitting element 2R, the green light-emitting element 2G, and the blue light-emitting element 2B. In particular, the electron-transport layer 10 does not have to be separated with either the first partition walls 20 or the second partition walls 22.

Here, in the steps of manufacturing the display device according to this embodiment, Step S4 in FIG. 9 may be omitted. Alternatively, at Step S4 in FIG. 9, only the first partition walls 20 may be formed to separate the cathode 6 alone. Moreover, in the steps of manufacturing the display device according to this embodiment, a partition wall may be formed, after the formation of the electron-transport layer 10, on the electron-transport layer 10 to separate the light-emitting layer 12 from the hole-transport layer 14.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

REFERENCE SIGNS LIST

1 Display Device
2 Light-Emitting Element
2R Red Light-Emitting Element
2G Green Light-Emitting Element
2B Blue Light-Emitting Element
6 Cathode
8 Anode
10 Electron-Transport Layer
12 Light-Emitting Layer
12R Red Light-Emitting Layer
12G Green Light-Emitting Layer
12B Blue Light-Emitting Layer
14 Hole-Transport Layer
16 First Electron-Transport Layer
18 Second Electron-Transport Layer
20 First Partition Wall
22 Second Partition Wall
28 First Hole-Transport Layer
30 Second Hole-Transport Layer
AL First Region
BL Second Region

The invention claimed is:

1. A light-emitting element, comprising:
a cathode;
an anode;
an electron-transport layer, a light-emitting layer, and a hole-transport layer provided, between the cathode and the anode, in a stated order from the cathode;
a first region in a plan view; and
a second region in the plan view and different from the first region, wherein
at least one of the electron-transport layer or the hole-transport layer includes, in the plan view, a first charge-transport layer provided in the first region, and a second charge-transport layer provided in the second region,
the first charge-transport layer and the second charge-transport layer contain different carrier-transport materials,
the light-emitting element shares the anode and the cathode between the first region and the second region, and
in the plan view, the first region has an area that is three times or more larger than an area of the second region.

* * * * *